(12) United States Patent
Tang et al.

(10) Patent No.: US 8,946,815 B2
(45) Date of Patent: Feb. 3, 2015

(54) FLOATING BODY TRANSISTOR CONSTRUCTIONS, SEMICONDUCTOR CONSTRUCTIONS, AND METHODS OF FORMING SEMICONDUCTOR CONSTRUCTIONS

(71) Applicant: Micron Technology, Inc., Boise, ID (US)

(72) Inventors: Sanh D. Tang, Boise, ID (US); Venkatesan Ananthan, Cupertino, CA (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 13/959,339

(22) Filed: Aug. 5, 2013

(65) Prior Publication Data
US 2013/0320440 A1    Dec. 5, 2013

Related U.S. Application Data

(62) Division of application No. 11/393,513, filed on Mar. 29, 2006, now Pat. No. 8,501,581.

(51) Int. Cl.
*H01L 29/772* (2006.01)
*H01L 29/78* (2006.01)
*H01L 27/108* (2006.01)

(52) U.S. Cl.
CPC .......... *H01L 29/7827* (2013.01); *H01L 27/108* (2013.01); *H01L 27/10802* (2013.01); *H01L 29/7841* (2013.01)
USPC .................................. 257/331; 257/E29.258

(58) Field of Classification Search
CPC ........................ H01L 29/7802; H01L 29/7841
See application file for complete search history.

(56) References Cited

U.S. PATENT DOCUMENTS

| 5,356,834 A | 10/1994 | Sugimoto et al. |
| 5,382,540 A | 1/1995 | Sharma et al. |
| 5,414,287 A | 5/1995 | Hong |

(Continued)

FOREIGN PATENT DOCUMENTS

| JP | 05-198817 | 8/1993 |
| JP | 09-293793 | 11/1997 |

(Continued)

OTHER PUBLICATIONS

Okhonin et al. "A Capacitor-Less 1T-DRAM Cell." IEEE Electron Device Letters, Feb. 2002, vol. 23, No. 2, pp. 85-87.*

(Continued)

*Primary Examiner* — Wensing Kuo
(74) *Attorney, Agent, or Firm* — Wells St. John P.S.

(57) ABSTRACT

The invention includes floating body transistor constructions containing U-shaped semiconductor material slices. The U-shapes have a pair of prongs joined to a central portion. Each of the prongs contains a source/drain region of a pair of gatedly-coupled source/drain regions, and the floating bodies of the transistors are within the central portions. The semiconductor material slices can be between front gates and back gates. The floating body transistor constructions can be incorporated into memory arrays, which in turn can be incorporated into electronic systems. The invention also includes methods of forming floating body transistor constructions, and methods of incorporating floating body transistor constructions into memory arrays.

24 Claims, 33 Drawing Sheets

(56) References Cited

U.S. PATENT DOCUMENTS

| | | | |
|---|---|---|---|
| 5,432,739 | A | 7/1995 | Pein |
| 5,483,094 | A | 1/1996 | Sharma et al. |
| 5,563,545 | A | 10/1996 | Scheinberg |
| 5,940,716 | A | 8/1999 | Jin et al. |
| 6,141,236 | A | 10/2000 | Kengeri |
| 6,396,108 | B1 | 5/2002 | Krivokapic |
| 6,552,435 | B2 | 4/2003 | Noble |
| 6,580,124 | B1 | 6/2003 | Cleeves et al. |
| 7,009,888 | B2 | 3/2006 | Masuoka et al. |
| 7,029,956 | B2 | 4/2006 | Hsu et al. |
| 7,053,447 | B2 | 5/2006 | Verhoeven |
| 2002/0140106 | A1 | 10/2002 | Kurjanowicz |
| 2002/0151130 | A1 | 10/2002 | Hsu et al. |
| 2004/0042256 | A1 | 3/2004 | Forbes |
| 2004/0056270 | A1 | 3/2004 | Hsu et al. |
| 2004/0174734 | A1 | 9/2004 | Forbes |
| 2004/0232471 | A1 | 11/2004 | Shukuri |
| 2005/0101087 | A1 | 5/2005 | Endoh et al. |
| 2005/0141262 | A1 | 6/2005 | Yamada et al. |
| 2006/0046407 | A1 | 3/2006 | Juengling |
| 2006/0261405 | A1 | 11/2006 | Forbes |
| 2007/0085124 | A1 | 4/2007 | Wong et al. |
| 2007/0228491 | A1 | 10/2007 | Forbes |
| 2008/0277711 | A1 | 11/2008 | Sommer |
| 2008/0290406 | A1 | 11/2008 | Tews |

FOREIGN PATENT DOCUMENTS

| | | |
|---|---|---|
| JP | 2003-031693 | 1/2003 |
| JP | 2005-191451 | 7/2005 |
| JP | 2005-327766 | 11/2005 |
| JP | 2007-018588 | 1/2007 |
| WO | WO 02/19396 | 3/2002 |
| WO | WO 2005/098928 | 10/2005 |
| WO | WO 2006/087798 | 8/2006 |
| WO | WO PCT/US2007/006445 | 9/2008 |

OTHER PUBLICATIONS

U.S. Appl. No. 11/393,513, filed Mar. 29, 2006, Tang et al.
PCT/US2007/006445 Search Rep., Mar. 14, 2007, Micron Technology, Inc.
PCT/US2007/006445 Written Op., Mar. 14, 2007, Micron Technology, Inc.
Fazan, "MOSFET Design Simplifies DRAM", EE Times, May 13, 2002, 5 pages.
Jeong et al., "A New Capacitorless 1T DRAM Cell: Surrounding Gate MOSFET with Vertical Channel (SGVC Cell)", IEEE Transactions on Nanotechnology, vol. 6, No. 3, May 2007, pp. 352-357.
Kuo et al., "A Capacitorless Double-Gate DRAM Cell Design for High Density Applications", IEEE © 2002, pp. 843-846.
Minami et al., "A Floating Body Cell (FBC) Fully Compatible with 90nm CMOS Technology (CMOS IV) for 128Mb SOI DRAM", IEEE © 2005, 4 pages.
Ohsawa et al., "Memory Design Using a One-Transistor Gain Cell on SOI", IEEE Journal of Solid-State Circuits, vol. 37, No. 11, Nov. 2002, pp. 1510-1522.
Okhonin et al., "A SOI Capacitor-less 1T-DRAM Concept", IEEE International SOI Conference, Oct. 2001, pp. 153-154.
Ranica et al., "Scaled 1T-Bulk Devices Built with CMOS 90nm Technoloyg for Low-Cost eDRAM Applications", Symposium on VLSI Technology Digest of Technical Papers, 2005, pp. 38-39.
Tanaka, "Scalability Study on a Capacitoryless 1T-DRAM from Single-Gate PD-SOI to Double-Gate FinDRAM", IEEE © 2004, pp. 37.5.1-37.5.4.
Yeo et al., "80nm 512M DRAM with Enhanced Data Retention Time Using Partially-Insulated Cell Array Transistor (PiCAT)", Symposium on VLSI Technology Digest of Technical Papers, IEEE © 2004, pp. 30-31.
Yoshida et al., "A Study of Highly Scalable DG-FinDRAM", IEEE Electron Device Letters, vol. 26, No. 9, Sep. 2005, pp. 655-657.
Yoshida et al.,"A Design of a Capacitorless 1T-DRAM Cell Using Gate-Induced Drain Leakage (GIDL) Current for Low-Power and High-Speed Embedded Memory", IEEE © 2003, 4 pages.

* cited by examiner

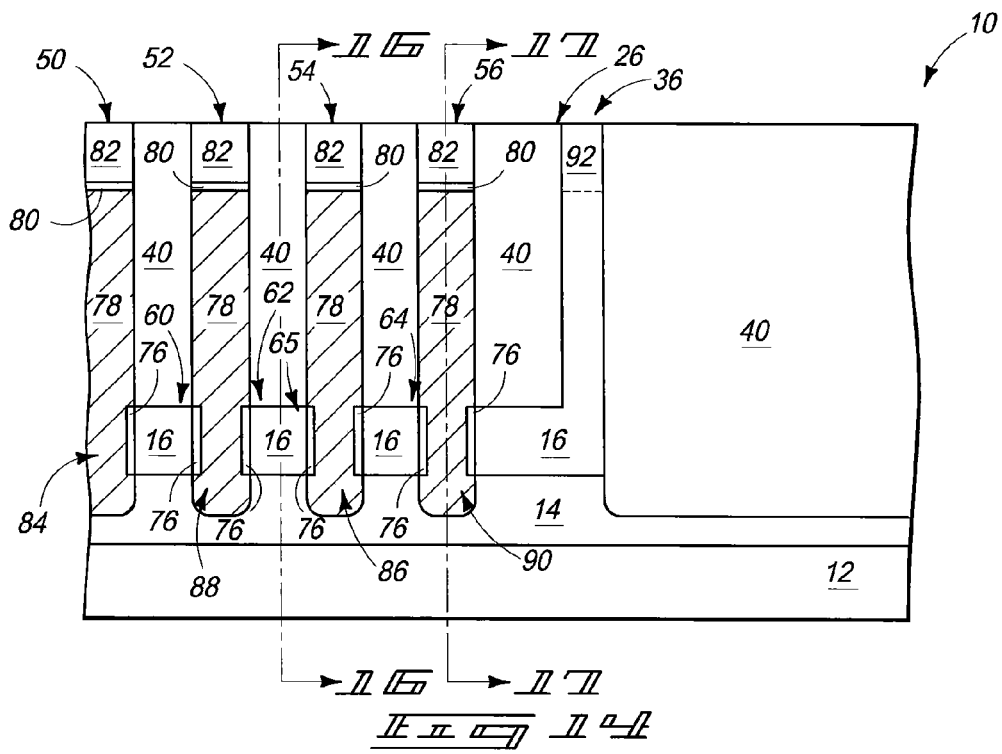
F I G 14
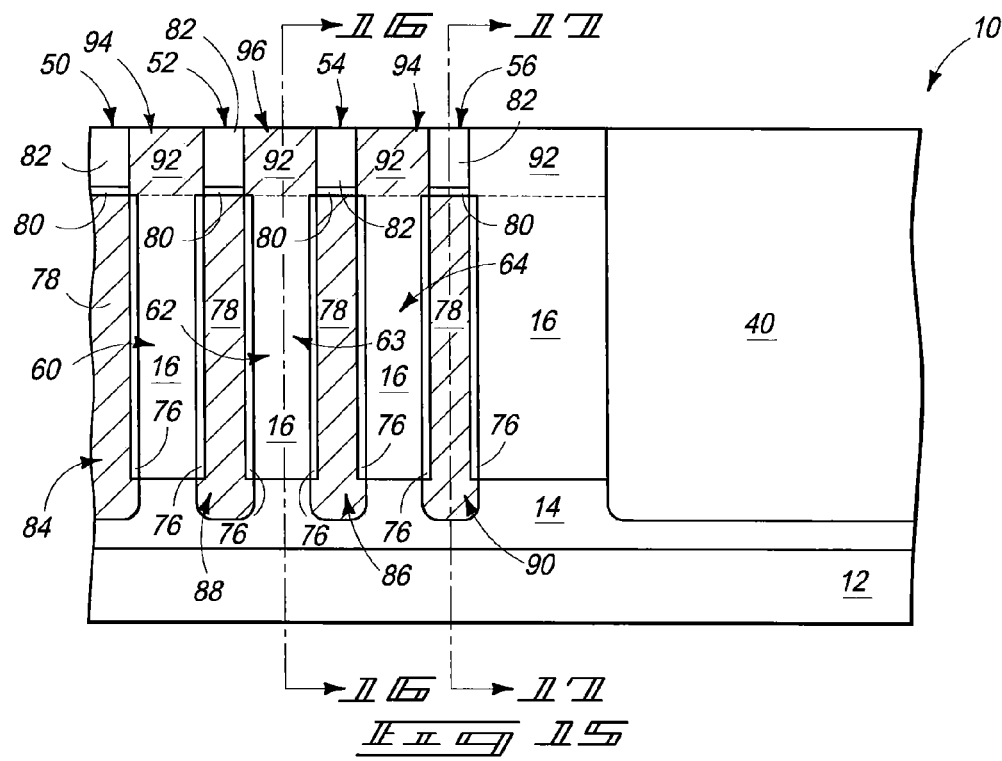
F I G 15

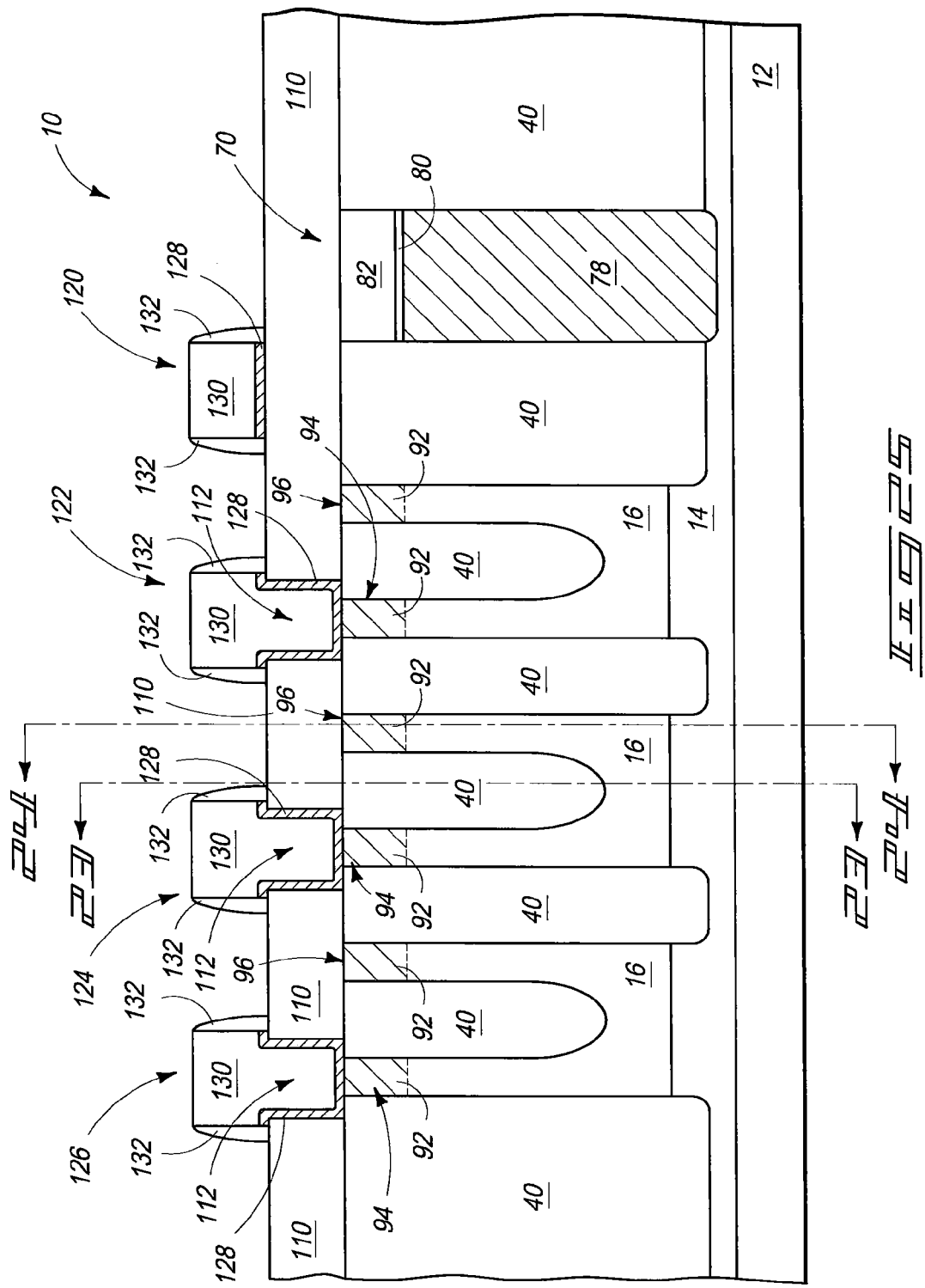

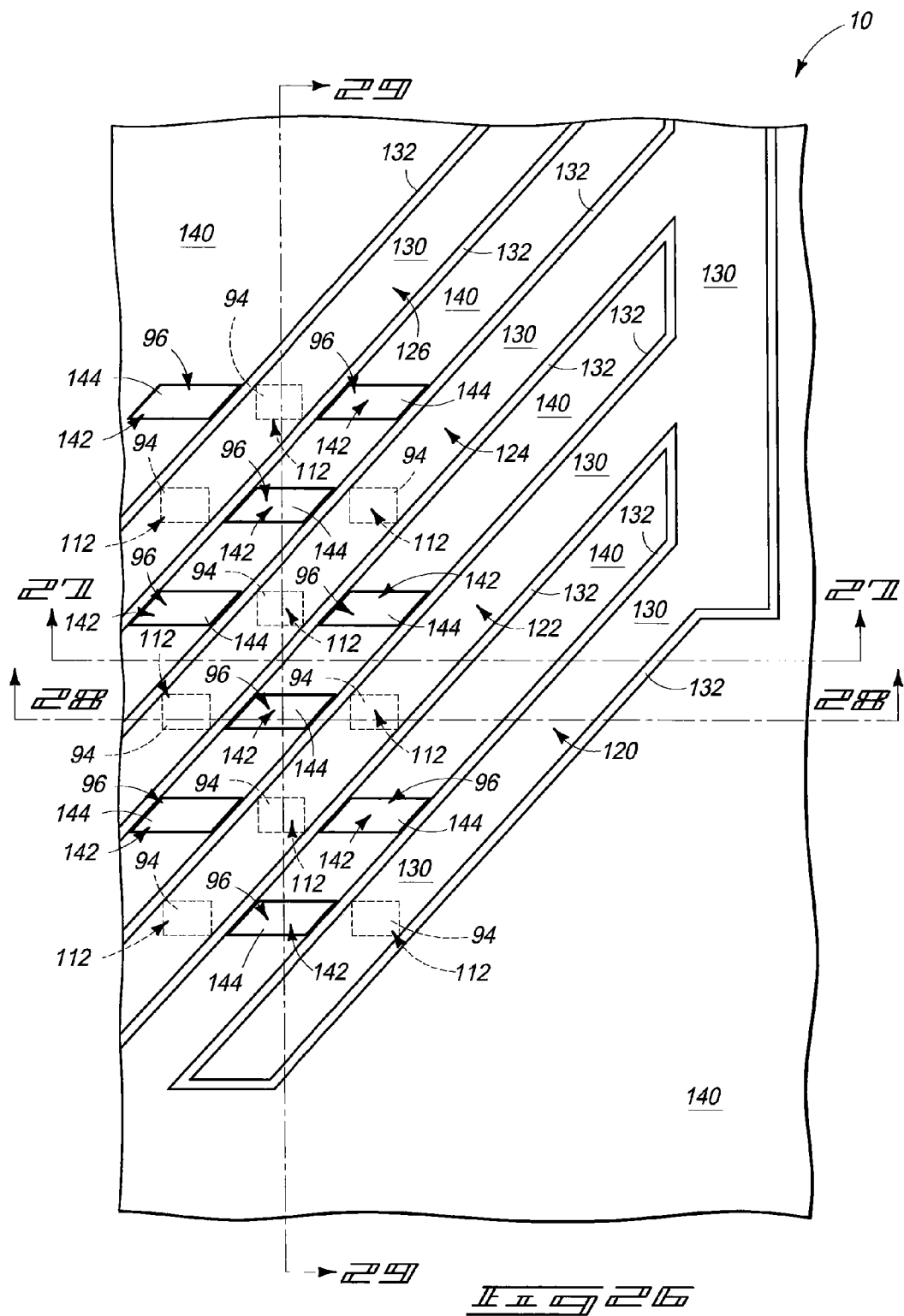
$F_{Ig}$ 26

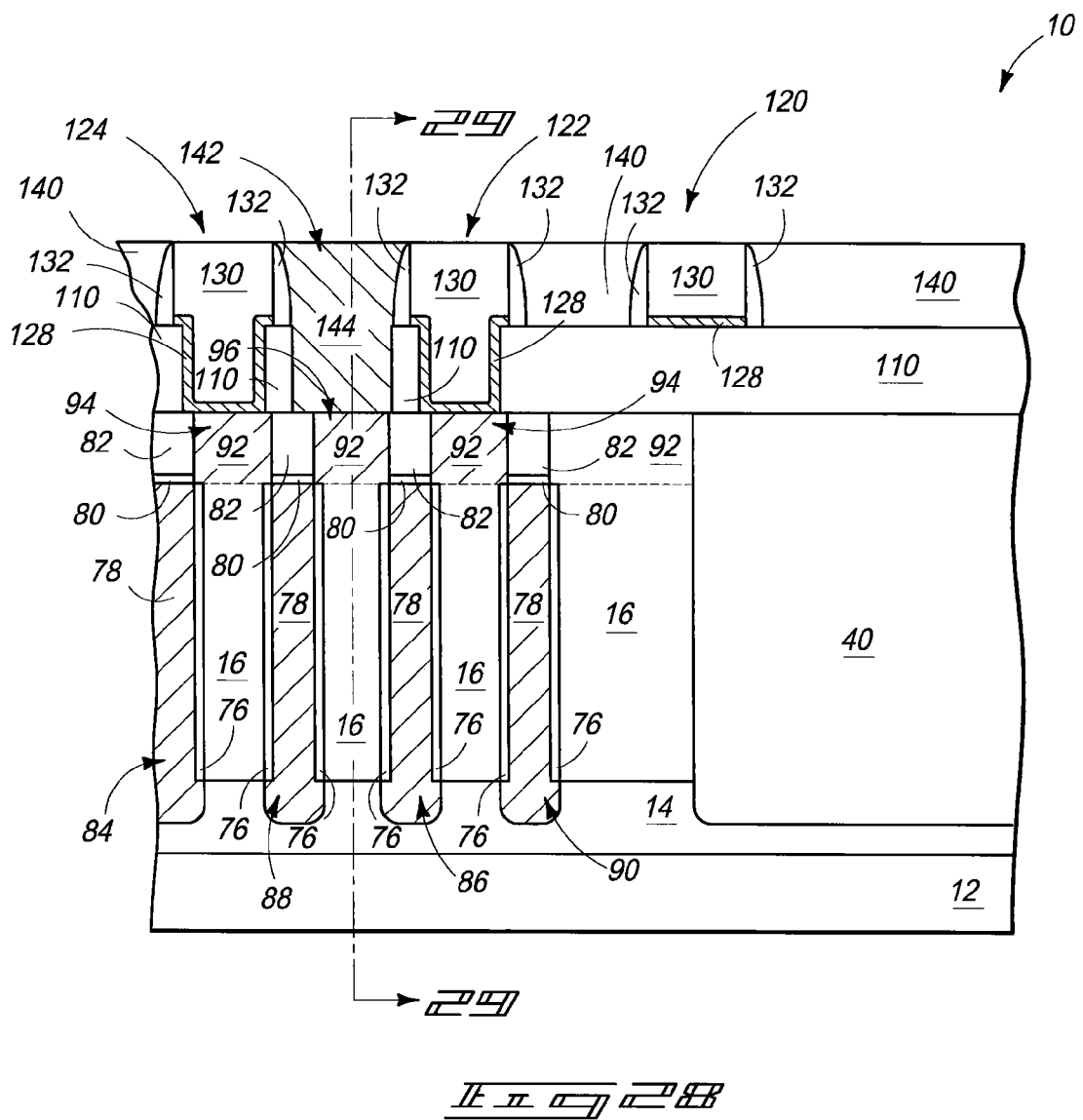
$F_{IG}$ 28

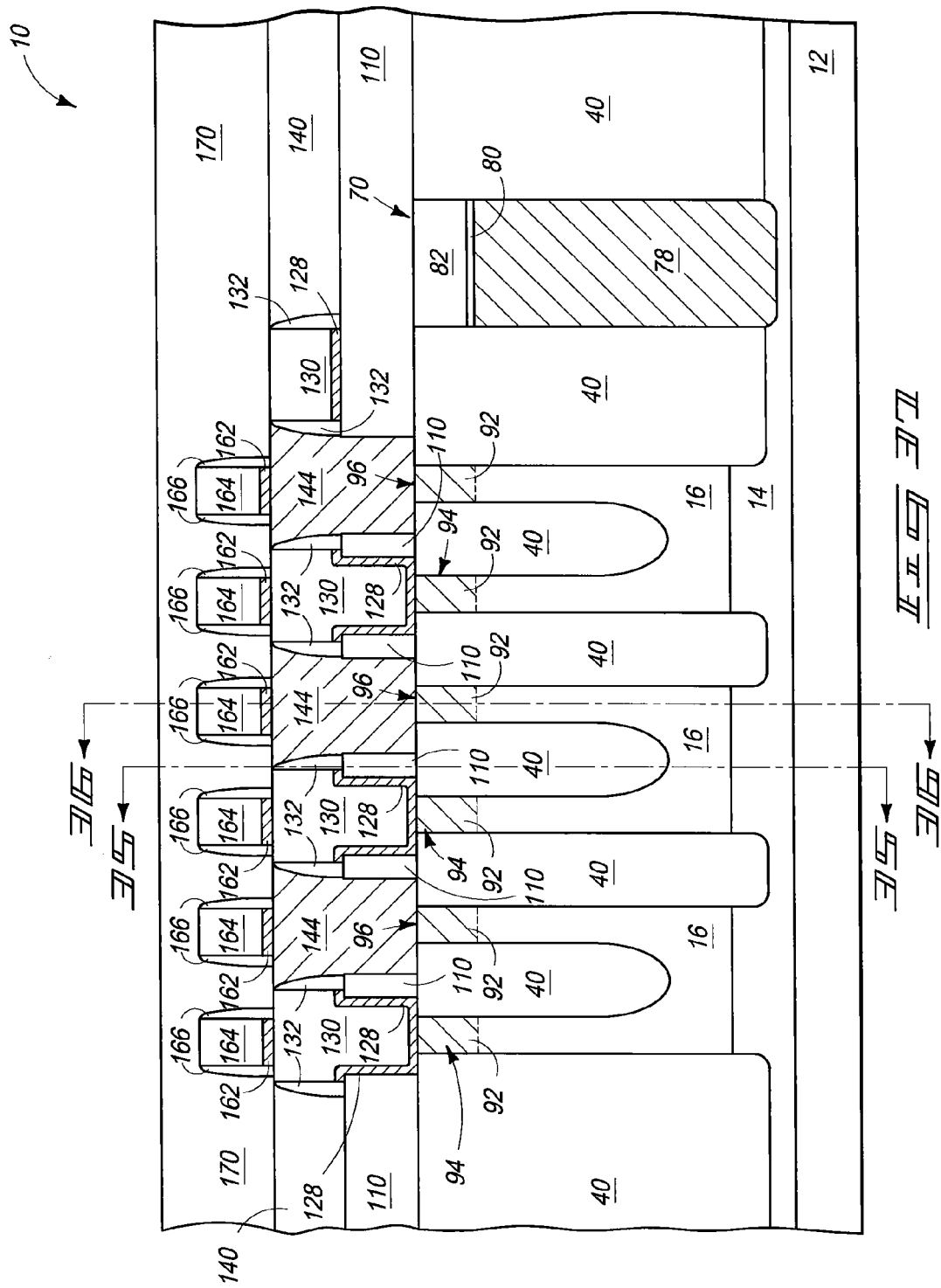

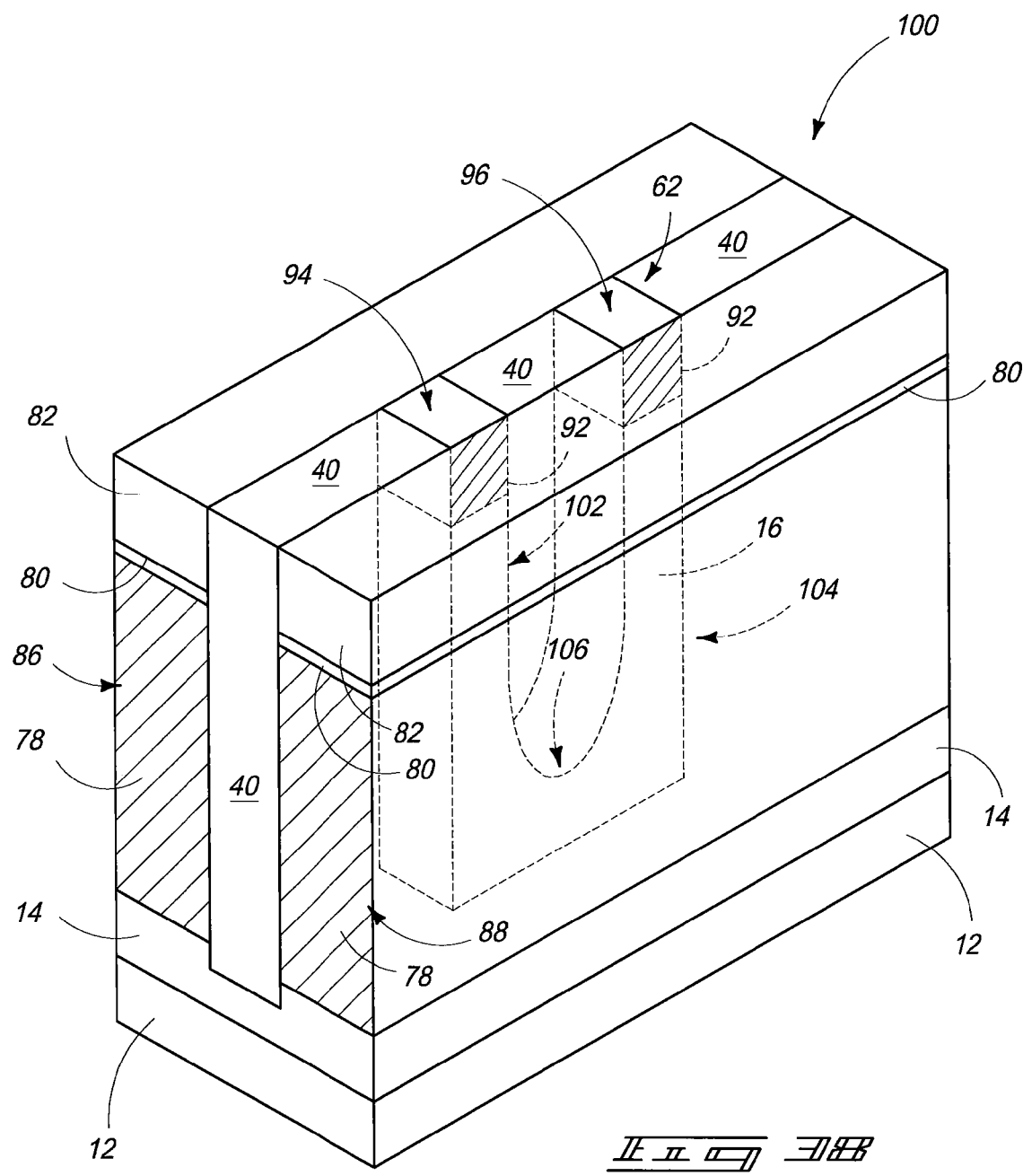

FLOATING BODY TRANSISTOR CONSTRUCTIONS, SEMICONDUCTOR CONSTRUCTIONS, AND METHODS OF FORMING SEMICONDUCTOR CONSTRUCTIONS

RELATED PATENT DATA

This patent resulted from a divisional application of U.S. application Ser. No. 11/393,513 which was filed Mar. 29, 2006 and which is incorporated by reference herein.

TECHNICAL FIELD

The invention pertains to semiconductor constructions and to methods of forming semiconductor constructions, and in particular aspects pertains to floating body transistor constructions and to methods of forming floating body transistor constructions.

BACKGROUND OF THE INVENTION

There is a continuing goal to produce highly-integrated, high-speed, low-power memory devices. Traditional memory devices are static random access memory (SRAM) and dynamic random access memory (DRAM). SRAM can operate at high speeds, but typically consumes a relatively large amount of semiconductor real estate relative to other types of memory. DRAM traditionally comprises a transistor and a capacitor, and individual DRAM unit cells can be formed to consume relatively small amounts of semiconductor real estate as compared to SRAM cells. However, even DRAM is becoming too large for next generation levels of integration, because it is becoming increasingly difficult to create satisfactory capacitors with increasing levels of integration.

There is currently substantial interest in a new type of capacitor-less DRAM (also referred to as a floating body cell) that may be able to achieve much higher levels of integration than the traditional DRAM that utilized a capacitor. The new memory uses a floating body of a partially or fully depleted silicon on insulator (SOI) field effect transistor (FET) as a storage node, instead of using a storage capacitor.

It would be desirable to develop floating body cells which can be readily incorporated into semiconductor fabrication processes. It would also be desirable to develop memory arrays using floating body cells, and to develop methods for forming such arrays.

Although the methods and structures described herein were developed, at least in part, for integration of floating body cells; it is to be understood that the invention can have additional applications.

BRIEF DESCRIPTION OF THE DRAWINGS

Preferred embodiments of the invention are described below with reference to the following accompanying drawings.

FIGS. 13-17 are views of the semiconductor construction of FIGS. 1-4 shown at a processing stage subsequent to that of FIGS. 9-12. The fragments of FIGS. 13-16 correspond to those of FIGS. 1-4, respectively; and the fragment of FIG. 17 is an additional view besides those of FIGS. 1-4. The cross-sections of FIGS. 14, 15, 16 and 17 are along the lines 14-14, 15-15, 16-16 and 17-17, respectively, of FIG. 13. The cross-section of FIGS. 16 and 17 are along lines 16-16 and 17-17, respectively, of FIGS. 14 and 15; and the cross-sections of FIGS. 14 and 15 are along the lines 14-14 and 15-15, respectively, of FIGS. 16 and 17.

FIGS. 22-25 are views of the fragments of FIGS. 1-4, respectively, shown at a processing stage subsequent to that of FIGS. 18-21. The cross-sections of FIGS. 23, 24 and 25 are along the lines 23-23, 24-24 and 25-25, respectively, of FIG. 22. The cross-section of FIG. 25 is along lines 25-25 of FIGS. 23 and 24; and the cross-sections of FIGS. 23 and 24 are along the lines 23-23 and 24-24, respectively, of FIG. 25.

FIGS. 26-29 are views of the fragments of FIGS. 1-4, respectively, shown at a processing stage subsequent to that of FIGS. 22-25. The cross-sections of FIGS. 27, 28 and 29 are along the lines 27-27, 28-28 and 29-29, respectively, of FIG. 26. The cross-section of FIG. 29 is along lines 29-29 of FIGS. 27 and 28; and the cross-sections of FIGS. 27 and 28 are along the lines 27-27 and 28-28, respectively, of FIG. 29.

FIGS. 30-33 are views of the fragments of FIGS. 1-4, respectively, shown at a processing stage subsequent to that of FIGS. 26-29. The cross-sections of FIGS. 31, 32 and 33 are along the lines 31-31, 32-32 and 33-33, respectively, of FIG. 30. The cross-section of FIG. 33 is along lines 33-33 of FIGS. 31 and 32; and the cross-sections of FIGS. 31 and 32 are along the lines 31-31 and 32-32, respectively, of FIG. 33.

FIGS. 34-37 are views of the fragments of FIGS. 1-4, respectively, shown at a processing stage subsequent to that of FIGS. 30-33. The cross-sections of FIGS. 35, 36 and 37 are along the lines 35-35, 36-36 and 37-37, respectively, of FIG. 34. The cross-section of FIG. 37 is along lines 37-37 of FIGS. 35 and 36; and the cross-sections of FIGS. 35 and 36 are along the lines 35-35 and 36-36, respectively, of FIG. 37.

FIG. 38 is a three-dimensional view of a fragment of the semiconductor construction at the processing stage of FIGS. 13-17.

DETAILED DESCRIPTION OF THE PREFERRED EMBODIMENTS

Figure 1:
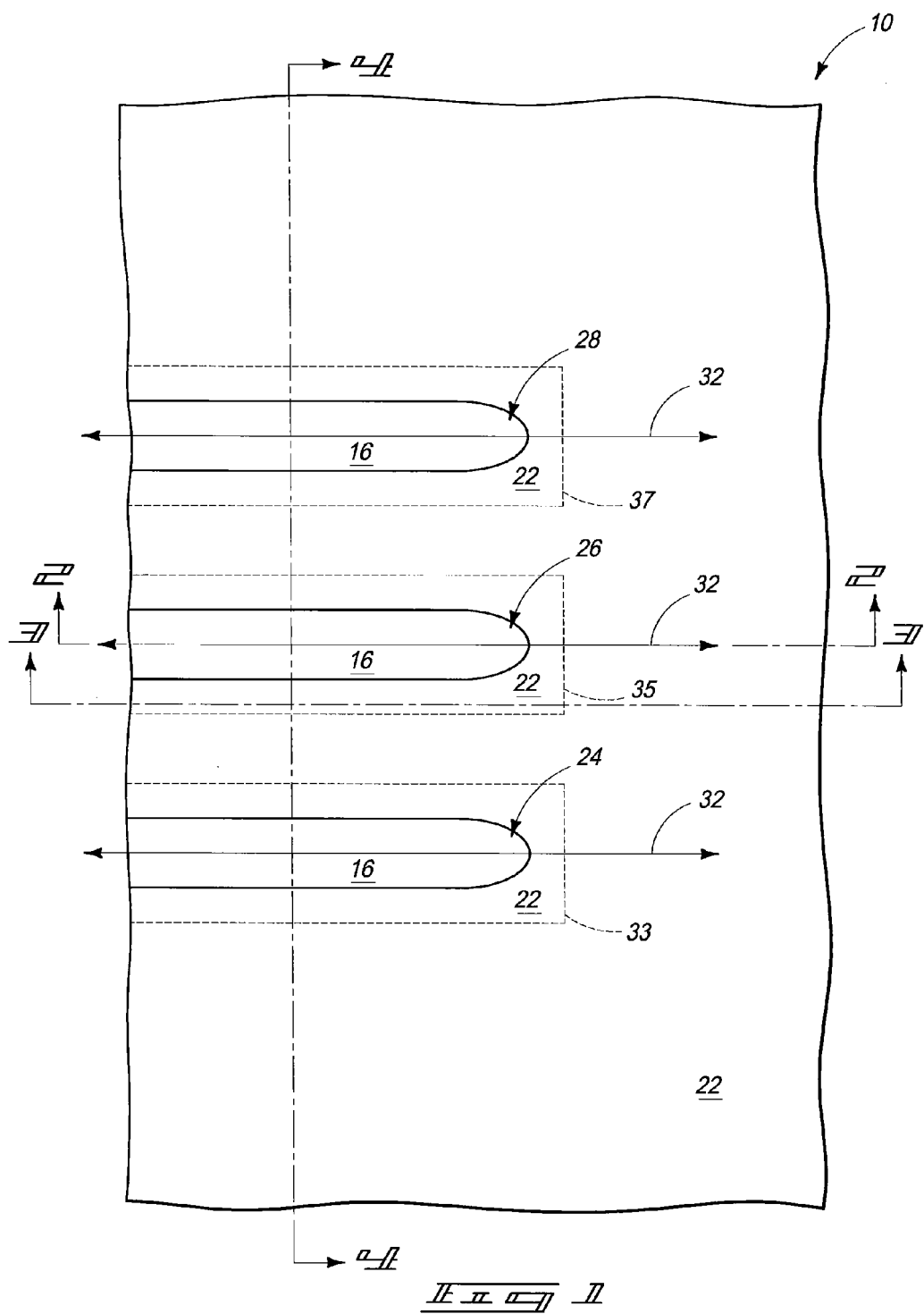
FIGS. 1-4 are a top view and cross-sectional side views of a fragment of a semiconductor construction at a preliminary processing stage of an exemplary aspect of the present invention. The cross-sections of FIGS. 2, 3 and 4 are along the lines 2-2, 3-3 and 4-4, respectively, of FIG. 1. The cross-section of FIG. 4 is along lines 4-4 of FIGS. 2 and 3; and the cross-sections of FIGS. 2 and 3 are along the lines 2-2 and 3-3, respectively, of FIG. 4.
Figure 2:
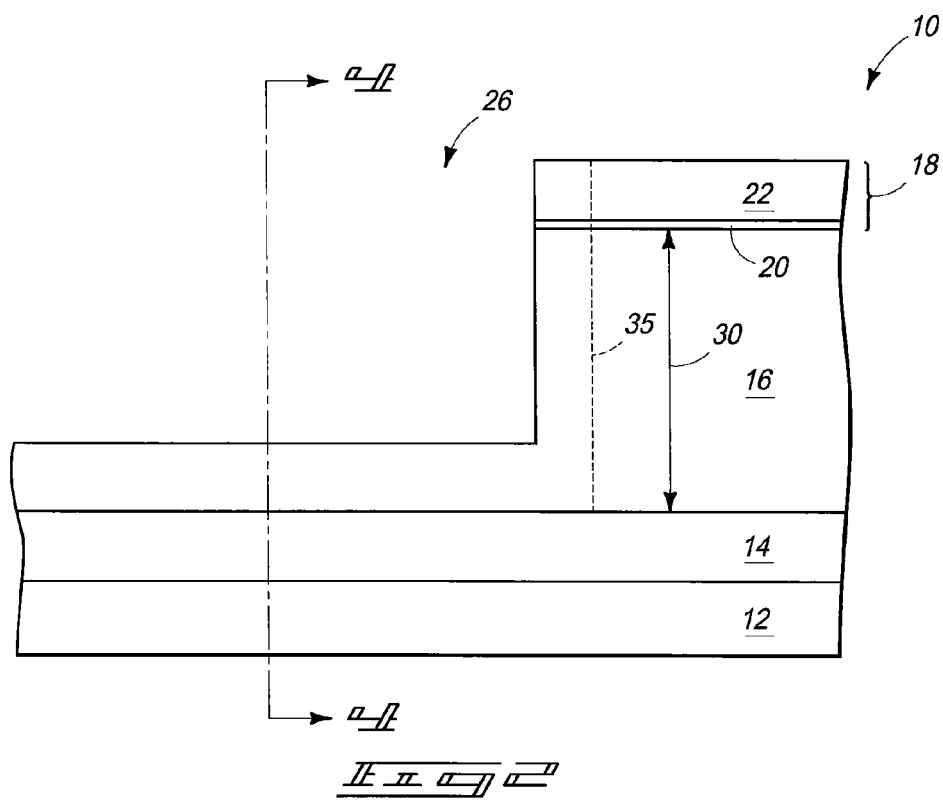
Figure 3:
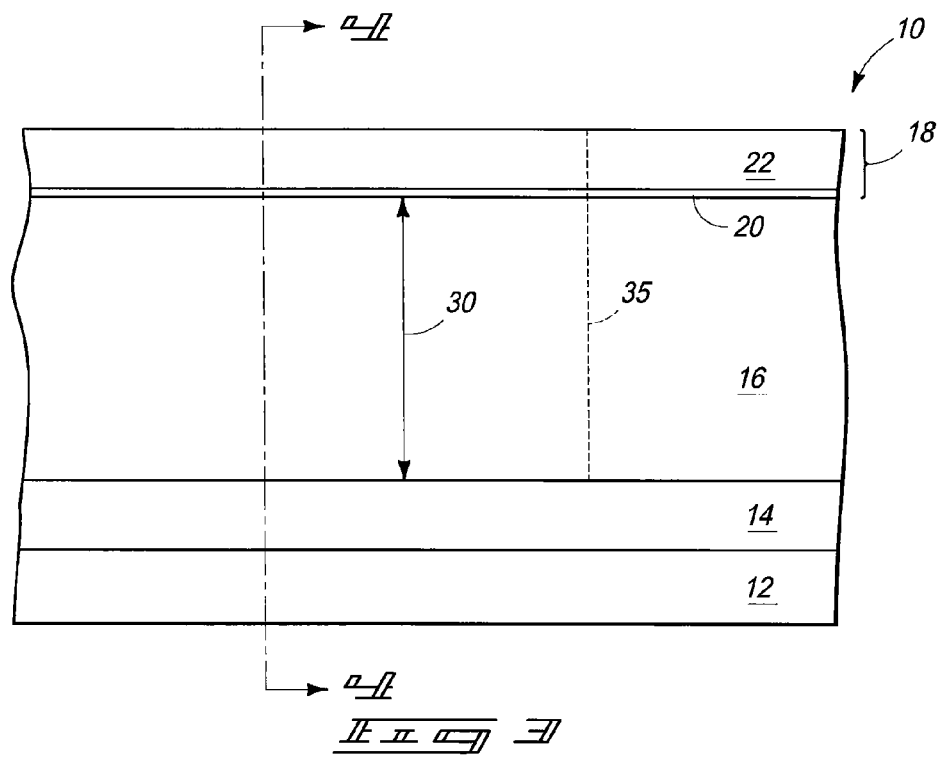
Figure 4:
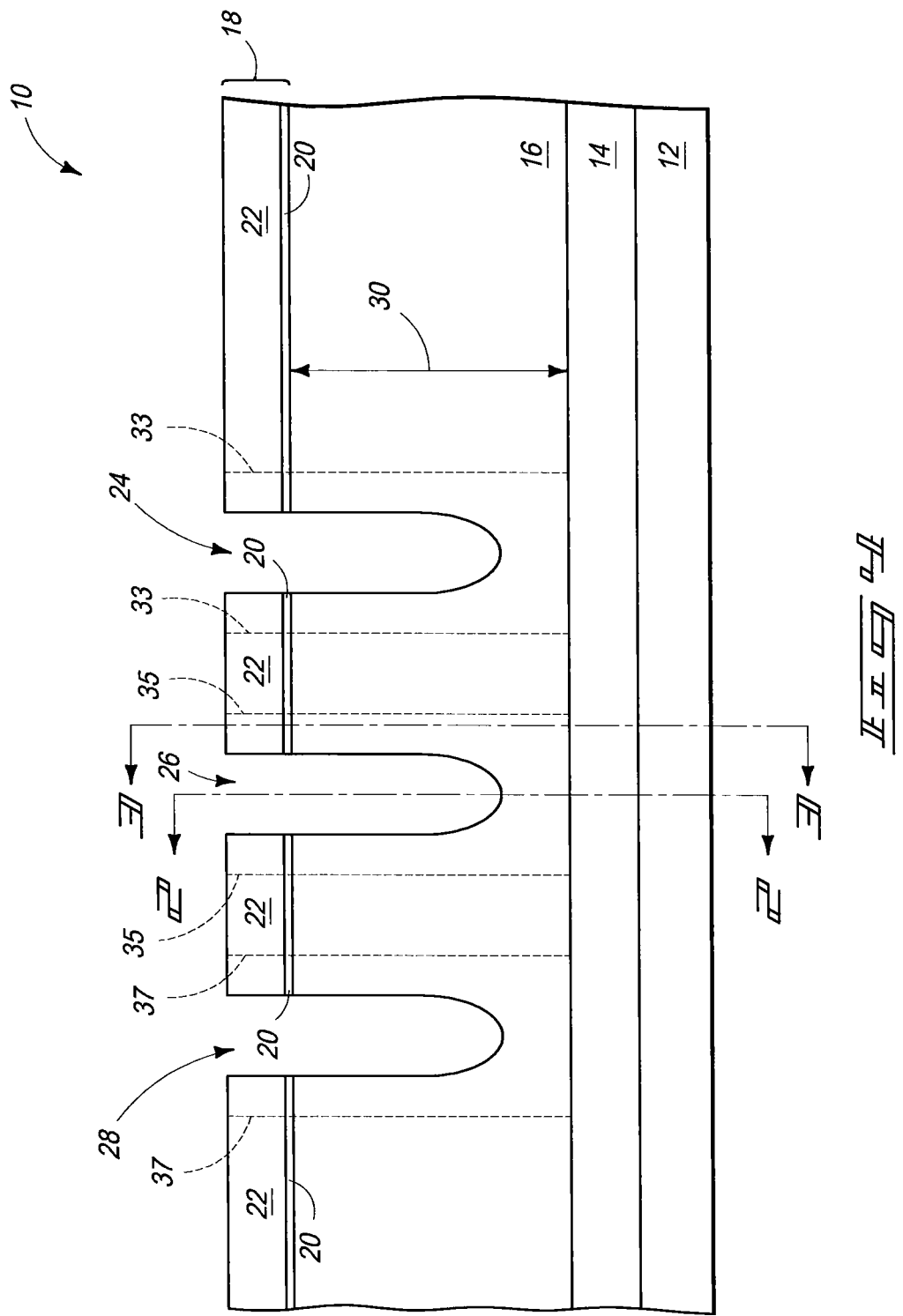

This disclosure of the invention is submitted in furtherance of the constitutional purposes of the U.S. Patent Laws "to promote the progress of science and useful arts" (Article 1, Section 8).

In particular aspects, the invention described herein pertains to a design for floating body transistor constructions in which source and drain lines are laid out along prongs of a U-shaped semiconductor fin. The layout can be reduced to $6F^2$ or smaller with current 90 nanometer technology when utilizing current pitch doubling procedures. Full feature $8F^2$ layouts may be manufacturable up to 40 nanometers and beyond. Structures formed in accordance with the present invention are expected to have high scalability, and good data retention.

Exemplary aspects of the invention are described with reference to FIGS. 1-38.

Referring initially to FIGS. 1-4, a semiconductor construction 10 is illustrated at a preliminary processing stage in accordance with an aspect of the present invention.

The construction 10 comprises a semiconductor base 12, an electrically insulative mass 14 (also referred to herein as an insulator 14) over the base, and semiconductor material 16 over the electrically insulative mass. The semiconductor material 16 and insulative material 14 can be considered to together be a semiconductor on insulator (SOI) construction.

Semiconductor base 12 can comprise any suitable semiconductor material, including, for example, bulk monocrystalline silicon of a silicon wafer. In some aspects, base 12 can be considered to be a semiconductor substrate. To aid in interpretation of the claims that follow, the terms "semiconductive substrate" and "semiconductor substrate" are defined to mean any construction comprising semiconductive material, including, but not limited to, bulk semiconductive materials such as a semiconductive wafer (either alone or in assemblies comprising other materials thereon), and semiconductive material layers (either alone or in assemblies comprising other materials). The term "substrate" refers to any supporting structure, including, but not limited to, the semiconductive substrates described above.

Although base 12 will typically comprise a semiconductor material, it is to be understood that the base can comprise other materials suitable for being supporting substrates in various aspects of the invention.

The electrically insulative material of mass 14 can comprise any suitable composition or combination of compositions, and in particular aspects will comprise, consist essentially of, or consist of silicon dioxide. Mass 14 can have a thickness of, for example, from about 1000 Å to about 1500 Å.

Semiconductor material 16 can comprise any suitable composition or combination of compositions, and in particular aspects will comprise, consist essentially of, or consist of silicon. Semiconductor material 16 will typically be monocrystalline, but it is be understood that the material can be in any suitable form. In the shown aspect of the invention, material 16 is directly against insulator 14.

Construction 10 comprises a patterned mask 18 over material 16, with the mask being shown to comprise layers 20 and 22. Layer 20 can correspond to pad oxide (in other words, can consist essentially of, or consist of silicon dioxide), and layer 22 can consist essentially of, or consist of silicon nitride. Layer 20 can be buffered oxide thermally grown over material 16, and can have a thickness of, for example, from about 50 Å to about 100 Å. Layer 22 can have a thickness of from about 500 Å to about 750 Å.

The mask 18 has openings 24, 26 and 28 extending therethrough, and such openings also extend into semiconductor material 16. The formation of the openings through mask 18 and into material 16 can be accomplished with any suitable processing, including, for example: formation of a photolithographically patterned resist mask (not shown) over layer 22, transference of a pattern from the resist mask to underlying layers 20 and 22 with one or more suitable etches, further transference of the pattern into material 16 with suitable etching, and removal of the resist mask.

Semiconductor material 16 is shown to have a thickness 30, and the openings 24, 26 and 28 are shown to extend only partially into material 16, and accordingly not entirely through the thickness of the material. The thickness 30 can be, for example, from about 1500 Å to about 2500 Å, and the openings 24, 26 and 28 can extend to, for example, about three-fourths of the way through such thickness.

The openings 24, 26 and 28 can be seen to extend linearly in the top view of FIG. 1, and further to extend substantially parallel to one another. The linear directions that the openings 24, 26 and 28 extend along can be defined to be latitudinal directions 32. In some aspects, openings 24, 26 and 28 can be considered to be first trenches extending primarily linearly along the defined latitudinal directions.

Dashed boundaries 33, 35 and 37 are provided around trenches 24, 26 and 28, respectively. The dashed boundaries correspond to locations where troughs will ultimately be patterned from semiconductor material 16, as will become more clear from the discussion follows.

Referring next to FIGS. 5-9, portions of materials 16, 20 and 22 are removed to form an opening 39, and leave separated structures 34, 36 and 38 along trenches 24, 26 and 28, respectively. Subsequently, opening 39 and trenches 24, 26 and 28 are filled with electrically insulative material 40. Electrically insulative material 40 can comprise any suitable composition or combination of compositions, and in particular aspects can comprise, consist essentially of, or consist of silicon dioxide.

The opening 39 extends entirely through the thickness of semiconductor material 16, and in the shown aspect extends partially into the electrically insulative mass 14. The opening 39 can, for example, extend about halfway through the thickness of insulative mass 14. In some aspects, opening 39 will correspond to a plurality of openings, rather than to a single large opening.

As discussed previously, trenches 24, 26 and 28 can be referred to as first trenches to distinguish them from other trenches formed within construction 10. In some aspects, the formation of opening 39 can be considered formation of one or more second trenches which leave a plurality of spaced regions of semiconductor material 16 (specifically, semiconductor material of structures 34, 36 and 38) extending along and under the first trenches. The individual spaced regions of semiconductor material are trough-shaped, as can be seen in the cross-section of FIG. 8. Such trough-spaced regions contain sidewalls 41 along the opposing sides of the first trenches 24, 26 and 28, and contain central (or bottom) regions 43 under the first trenches. The trough-shaped structures are formed in the locations 33, 35 and 37 of FIGS. 1-4.

In some aspects, the semiconductor material extending around first trenches 24, 26 and 28 can be considered to be U-shaped; with the sidewalls 41 being considered to be limbs or prongs of the U-shaped structures, and with the central regions 43 considered to be base or central portions of the U-shaped structures. In yet other alternative aspects, the sidewalls 41 can be considered to be upwardly-extending from central valley portions corresponding to regions 43.

Figure 5:
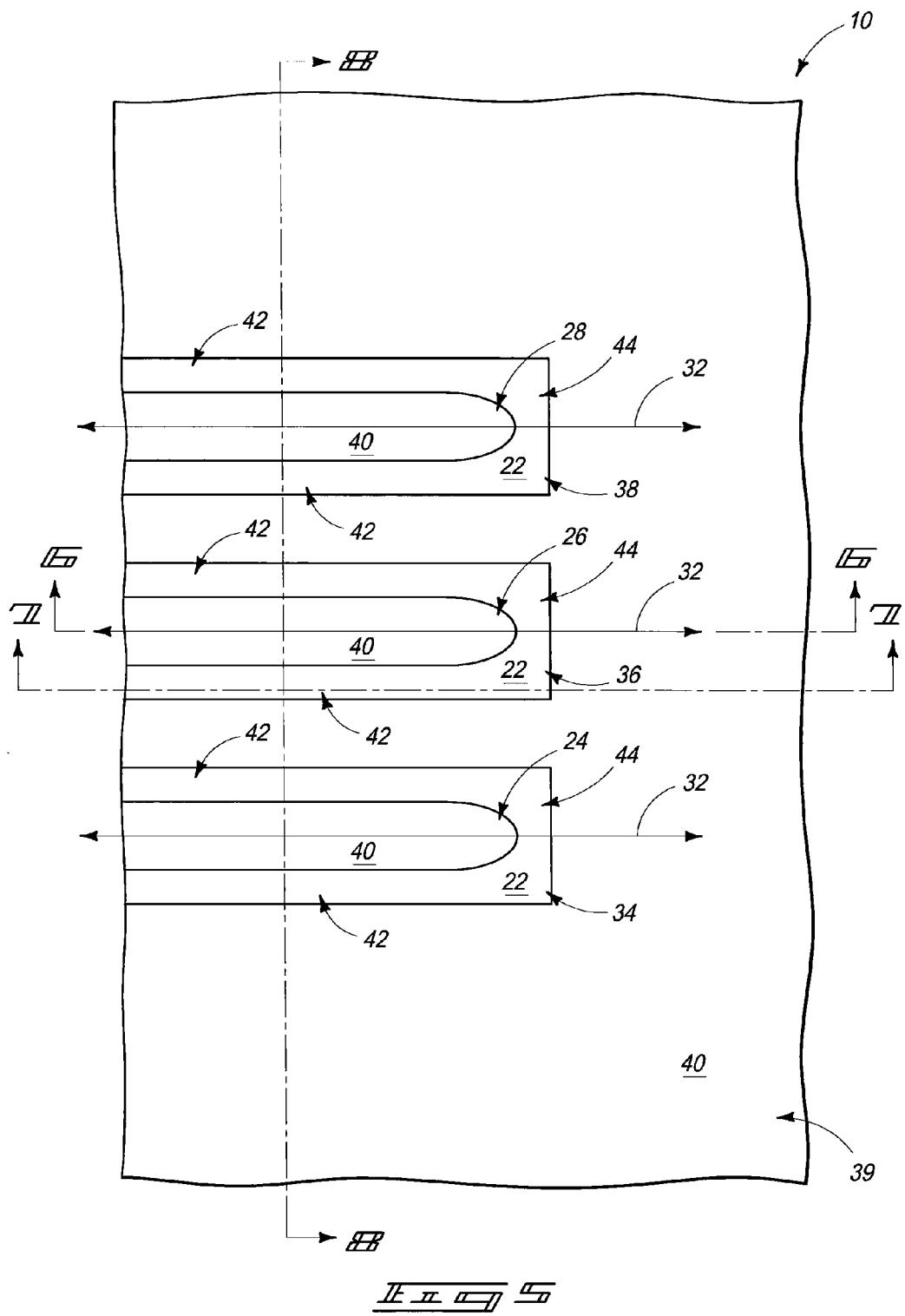
FIGS. 5-8 are views of the fragments of FIGS. 1-4, respectively, shown at a processing stage subsequent to that of FIGS. 1-4. The cross-sections of FIGS. 6, 7 and 8 are along the lines 6-6, 7-7 and 8-8, respectively, of FIG. 5. The cross-section of FIG. 8 is along lines 8-8 of FIGS. 6 and 7; and the cross-sections of FIGS. 6 and 7 are along the lines 6-6 and 7-7, respectively, of FIG. 8.
Figure 6:
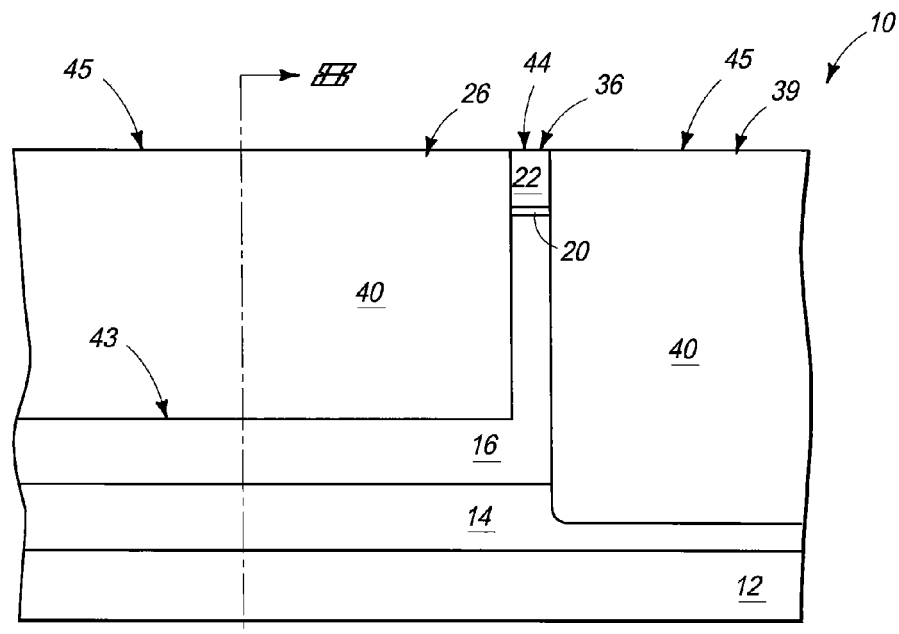
Figure 7:
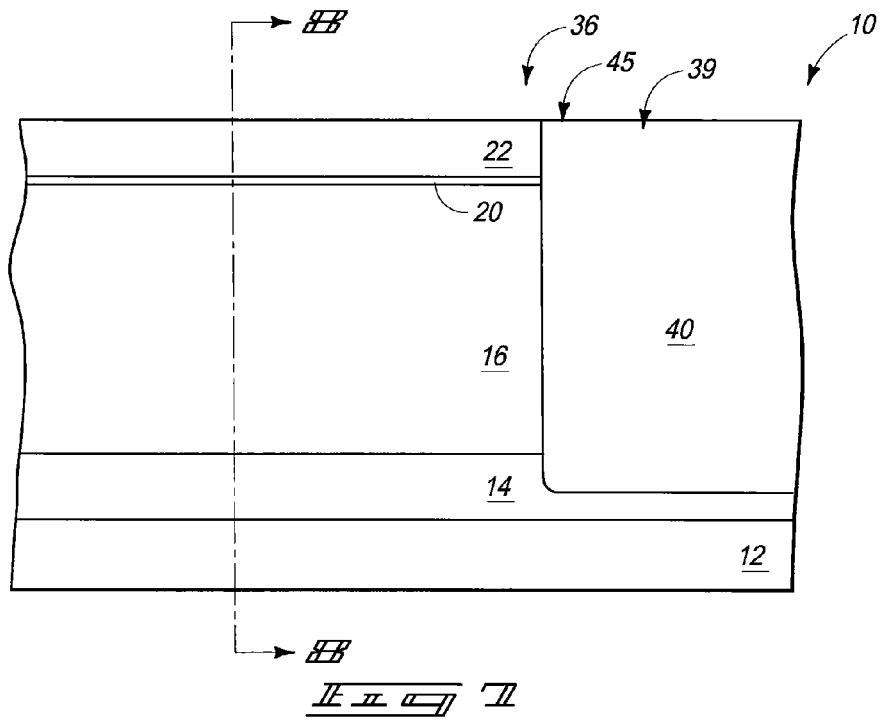
Figure 8:
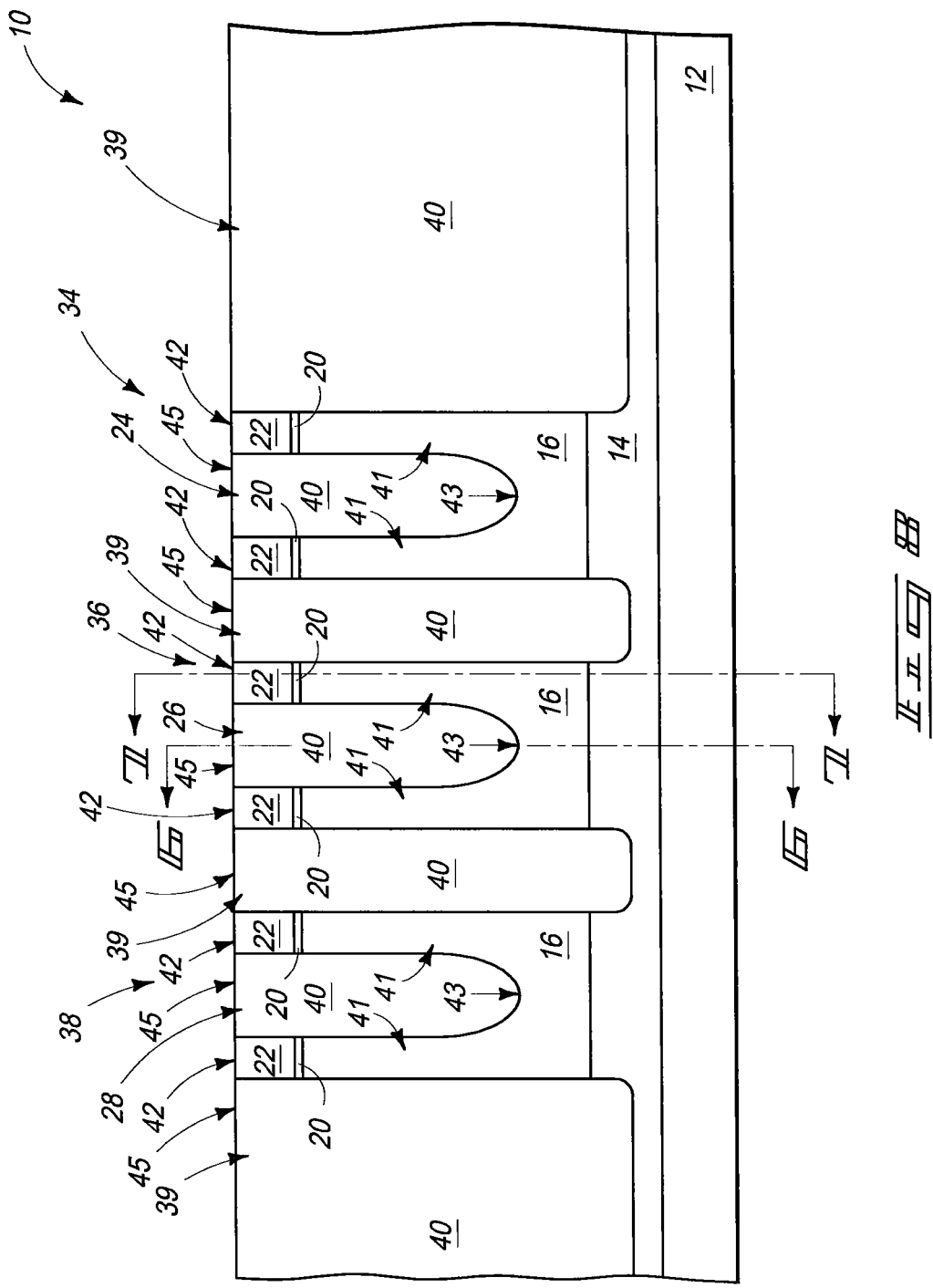

The regions 34, 36 and 38 can be seen in FIG. 5 to have elongated segments 42 extending longitudinally along the trenches, and to have ends 44 connecting the elongated segments. The sidewalls of the troughs shown in FIG. 8 are along the elongated segments 42. However, is noted that there are also sidewalls along the ends 44, as can be seen in FIG. 6.

The insulative material 40 fills the trenches 24, 26, and 28. Such trenches can be considered to be troughs of the trough-shaped regions 34, 36 and 38 of semiconductor material 16; and thus insulative material 40 can be considered to fill the troughs (or alternatively valleys) of the trough-shaped regions of semiconductor material 16.

Insulative material 40 is shown to have a planarized upper surface 45. Such can be formed by initially providing material 40 to overfill trenches 24, 26 and 28, as well as opening 39; and to then subject material 40 to polishing to remove the material from over layer 22 and create the planarized upper surface 45. Suitable polishing can be chemical-mechanical polishing (CMP), and layer 22 can function as a stop during such polishing.

Opening 39 can be considered a deep opening, in that it is deeper than the trenches 24, 26 and 28. The formation of the opening 39 can be accomplished with any suitable processing, including, for example: formation of a photolithographically patterned resist mask (not shown) over layer 22 and trenches 24, 26 and 28; transference of a pattern from the resist mask to underlying layers 20 and 22 with one or more suitable etches; further transference of the pattern through material 16 and then partially into insulator 14, with suitable etching; and removal of the resist mask.

Although deep opening 39 is described as being formed after shallow trenches 24, 26 and 28 in the shown exemplary aspect of the invention, it is to be understood that the invention also encompasses aspects in which the order of formation of the deep opening and shallow trenches is reversed. Also, although the deep opening and shallow trenches are shown to be simultaneously filled with insulative material 40, it is to be understood that the insulative material could be provided within the shallow trenches prior to formation of the deep opening, or vice versa. Further, it is to be understood that the insulative material within the shallow trenches may be compositionally different than that within the deep opening in some aspects the invention.

Referring next to FIGS. 9-12, trenches 50, 52, 54 and 56 are formed to extend through the trough-shaped semiconductor material structures of regions 34, 36 and 38. The trenches extend through masking materials 20 and 22, through semiconductor material 16, and partially into insulator 14. In particular aspects, the trenches 50, 52, 54 and 56 can extend to about halfway through the thickness of insulator 14. The formation of trenches 50, 52, 54 and 56 can be accomplished with any suitable processing, including, for example: formation of a photolithographically patterned resist mask (not shown) across construction 10 to define locations of the trenches; transference of a pattern from the resist mask to underlying layers 20 and 22 with one or more suitable etches; further transference of the pattern through material 16 and then partially into insulator 14, with suitable etching; and removal of the resist mask.

Figure 10:
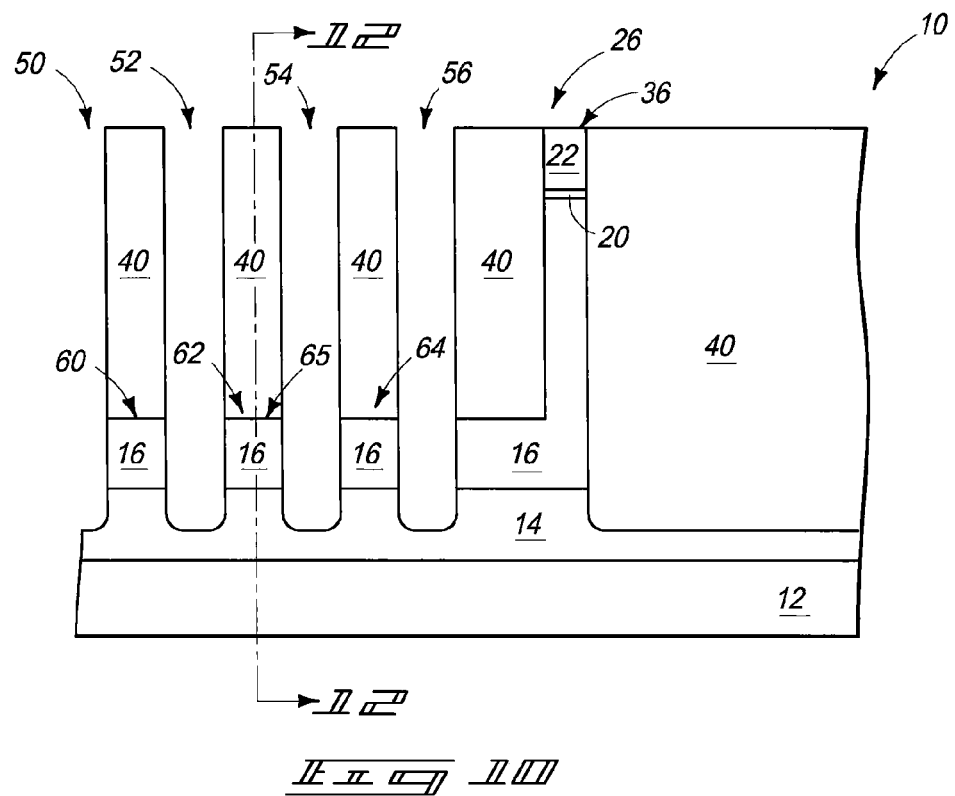
Figure 11:
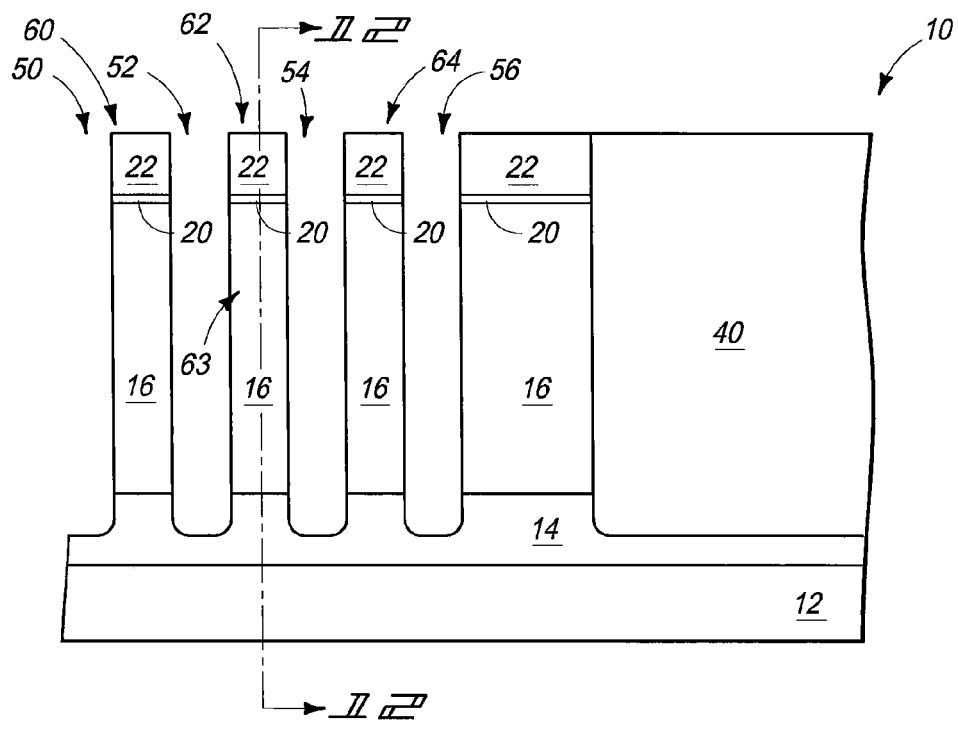
Figure 12:
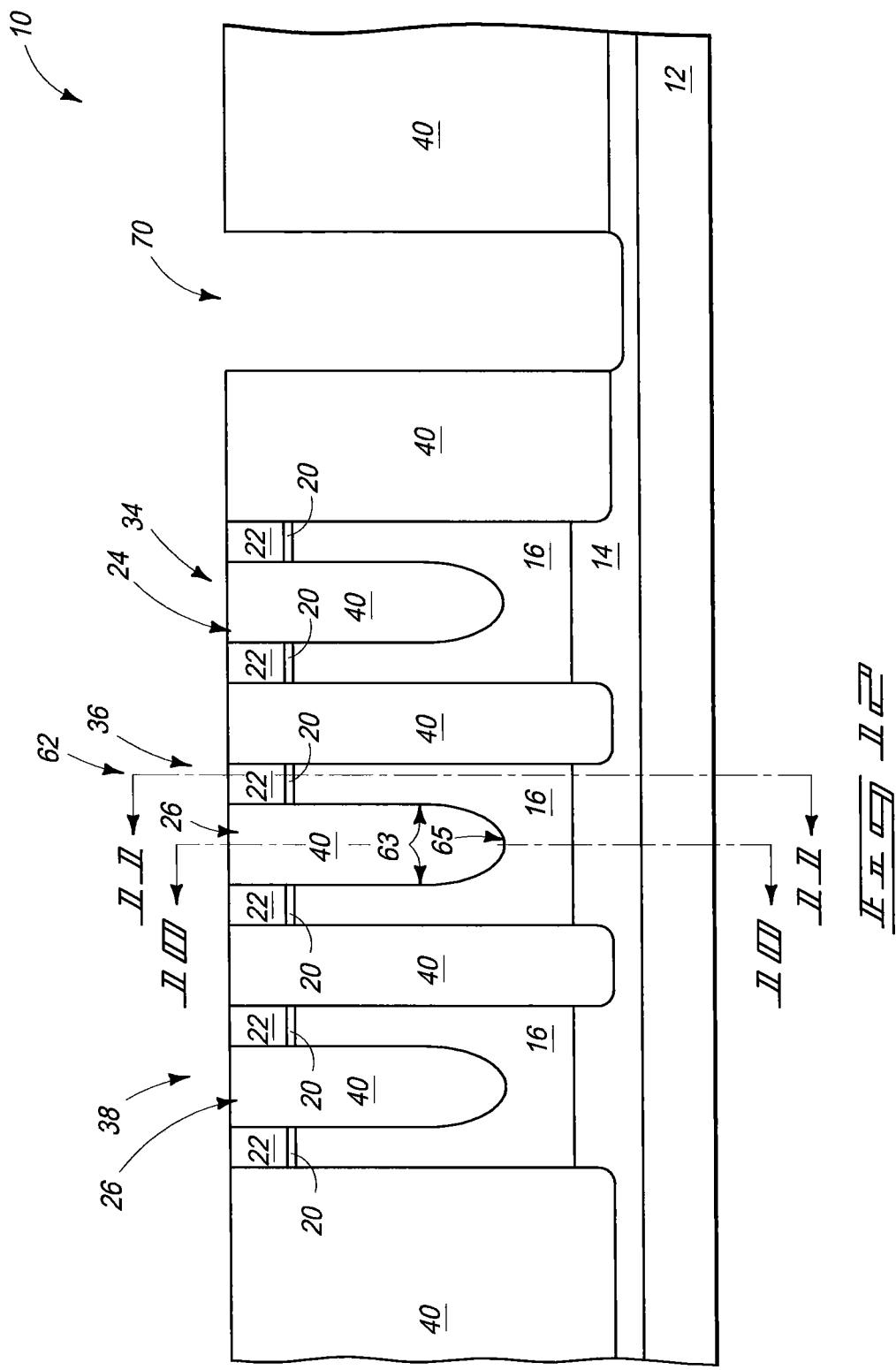
Figure 13:
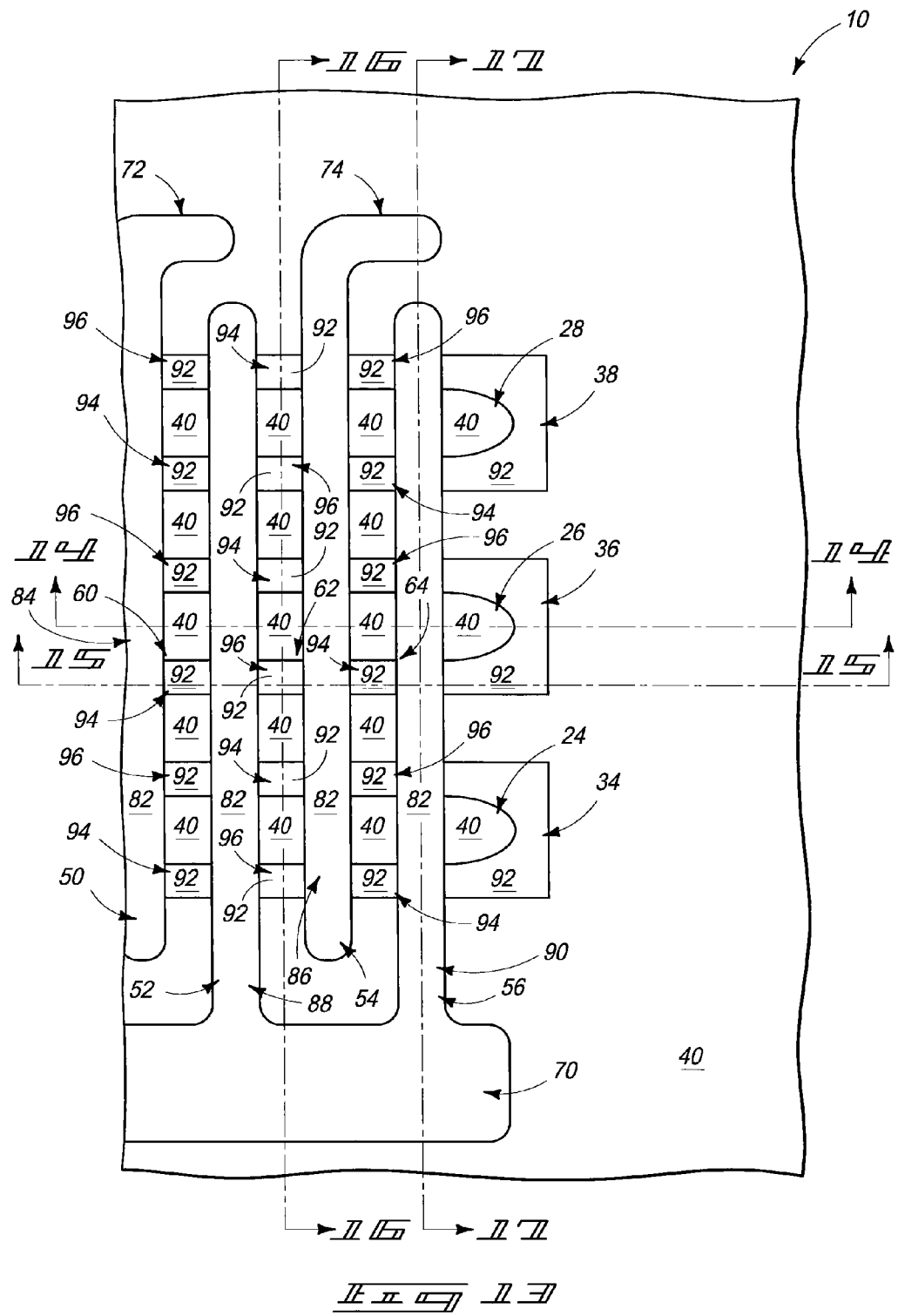

The trenches 50, 52, 54 and 56 subdivide the trough-shaped structures into a plurality of trough-shaped slices sandwiched adjacent between pairs of the trenches. Individual trough-shaped slices subdivided from region 36 are labeled as slices 60, 62 and 64. Slice 62 is shown in FIG. 12 to comprise upwardly-projecting sidewalls 63 joining to a central bottom region 65. The cross-sections of FIGS. 10 and 11 are through the bottom portion 65 and a sidewall 63, respectively. Trenches 50, 52, 54 and 56 can be referred to as a third trenches in some aspects of the invention to distinguish them from the first trenches 24, 26 and 28, and the second trench 39 (FIGS. 5-8).

The trenches 50, 52, 54 and 56 have peripheries comprising the various materials 14, 16, 20 and 22; as can be seen in the cross-sections of FIGS. 10-12.

In the shown aspect of the invention, the trenches 50, 52, 54 and 56 extend primarily linearly along longitudinal directions 68 which are substantially orthogonal to the latitudinal directions 32. The term "substantially orthogonal" is used indicate that the longitudinal directions are orthogonal to the latitudinal directions within tolerances of fabrication and measurement, which can include but is not limited to applications in which the longitudinal directions are absolutely orthogonal to the latitudinal directions.

The trenches 52 and 56 join at an interconnecting region 70 which is peripheral to an array of the trough-shaped slices of semiconductor material 16. Interconnecting region 70 ultimately provides electrical interconnection between conductive materials formed within trenches 52 and 56, (specifically, back gates) as will become clear from the discussion follows. Interconnecting region 70 can also provide a widened pad suitable for electrical connection to other layers, as will become clear from the discussion follows. In some aspects, (not shown) trenches 52 and 56 are not interconnected. In such aspects, back gates ultimately formed within the trenches can be interconnected at another level besides that of the trenches 52 and 56; or at least some the back gates can be left unconnected to one another so that they can be separately biased and/or modulated.

Trenches 50 and 54 comprise widened regions 72 and 74 which can ultimately be utilized for patterning widened pads of conductive material suitable for electrical connection to other layers.

Referring next to FIGS. 13-17, semiconductor material regions along the peripheries of the third trenches 50, 52, 54 and 56 are lined with one or more dielectric materials 76. In particular aspects, the one or more dielectric materials comprise, consist essentially of, or consist of silicon dioxide. If the dielectric material consists of silicon oxide, such can be referred to as gate oxide. The gate oxide can be formed by thermally growing the oxide from exposed regions of semiconductor material 16.

After the dielectric material 76 is formed, conductive gate material 78 is formed within the trenches 50, 52, 54 and 56. The conductive gate material can comprise any suitable composition or combination of compositions, and in particular aspects will comprise one or more metals. For instance, the conductive gate material can comprise, consist essentially of, or consist of one or more of titanium, ruthenium and titanium nitride. In the shown aspect of the invention, the conductive gate material 78 only partially fills the trenches 50, 52, 54 and 56, and specifically upper regions of the trenches are not filled by the conductive gate material. Such construction can be achieved by initially forming the conductive material to completely fill the trenches 50, 52, 54 and 56; and then recessing the conductive material within the trenches to leave the unfilled upper portions of the trenches. In particular aspects, the unfilled upper portions will be about 500 angstroms deep.

In the shown aspect the invention, electrically insulative caps are formed within the unfilled upper portions of the trenches over conductive material 78, with such caps comprising insulative materials 80 and 82. In some aspects, material 80 can comprise, consist essentially of, or consist of silicon dioxide; and material 82 can comprise, consist essentially of, or consist of silicon nitride. Also, it is to be understood that even though the caps are shown to comprise two different insulative materials, the invention includes other aspects (not shown) in which the caps comprise only one electrically insulative material, as well as aspects in which the caps comprise more than two electrically insulative materials.

The conductive material 78 within trenches 50, 52, 54 and 56 forms gatelines within each of the trenches. The gatelines can be considered to be planar gatelines, or in some aspects gate plates, in that the gatelines have relatively tall thin shapes as shown in the cross-sections of FIGS. 14, 15 and 17. The planar gates are spaced from semiconductor material 16 by the dielectric material 76.

In particular aspects, the planar gates can be considered to be alternating front gates and back gates; with the front gates being labeled 84 and 86, and the back gates being labeled 88 and 90. Notably, the back gates are electrically connected (in other words, electrically tied) to one another in the shown aspect through interconnect region 70. Thus, the back gates can be readily maintained at a common bias. As discussed previously, the invention can include other aspects in which the back gates are electrically tied through an interconnection at another level besides that of the gates, and yet other aspects in which at least some of the back gates are not electrically tied to one another.

In the shown aspect of the invention, the front gates and back gates are formed simultaneously with one another and accordingly have the same compositions as one another. It is to be understood, however, that the invention also includes aspects (not shown) in which the front gates and back gates differ in composition relative to one another. Also, although the shown aspect of the invention has the gate dielectric materials associated with the front gates being formed at the same time and of the same composition as the dielectric materials associated with the back gates (with all of such dielectric materials being indicated by the label 76), it is to be understood that the invention can also include aspects in which the dielectric materials associated with the back gates differ from those associated with the front gates.

The masking materials 20 and 22 (FIGS. 9-12) have been removed at the processing stage of FIGS. 13-17, and additional semiconductor material 92 has been formed over semiconductor material 16 in place of such masking materials. A dashed-line boundary is provided between semiconductor materials 16 and 92 to indicate an interface between such semiconductor materials, but it is to be understood that semiconductor materials 16 and 92 can be identical in composition to one another so that the materials merge to form a single material.

Masking materials 20 and 22 can be removed with any suitable etch, and in some aspects regions of construction 10 peripheral to materials 20 and 22 will be protected with a photoresist mask (not shown) during removal of material 20 and 22, and possibly also during formation of semiconductor material 92, and the photoresist mask will then be removed. Materials 20 and 22 can be referred to as sacrificial materials, in that they are ultimately removed.

In some aspects, semiconductor material 16 consists of, or consists essentially of monocrystalline silicon; and semiconductor material 92 consists of, or consists essentially of monocrystalline silicon epitaxially grown from the monocrystalline silicon of semiconductor material 16. Thus, in some aspects semiconductor material 92 can be compositionally the same as semiconductor material 16.

The semiconductor material 92 is conductively doped to form source regions 94 alternating with drain regions 96. The conductive doping of material 92 can be accomplished with any suitable processing, including in situ doping and/or implant doping of the semiconductor material. The dopant can be either n-type or p-type.

The trough-shaped semiconductor slices of the processing stage of FIGS. 13-17 can be considered to comprise upwardly-projecting sidewalls (or prongs) containing the combined semiconductor materials 16 and 92. The source/drain regions 94 and 96 are within such upwardly-projecting sidewalls. The source/drain regions can extend to any suitable depth into the sidewalls, including, for example, partially into material 92, entirely through material 92 to the interface with material 16, or entirely through material 92 and partially into material 16.

Figure 16:
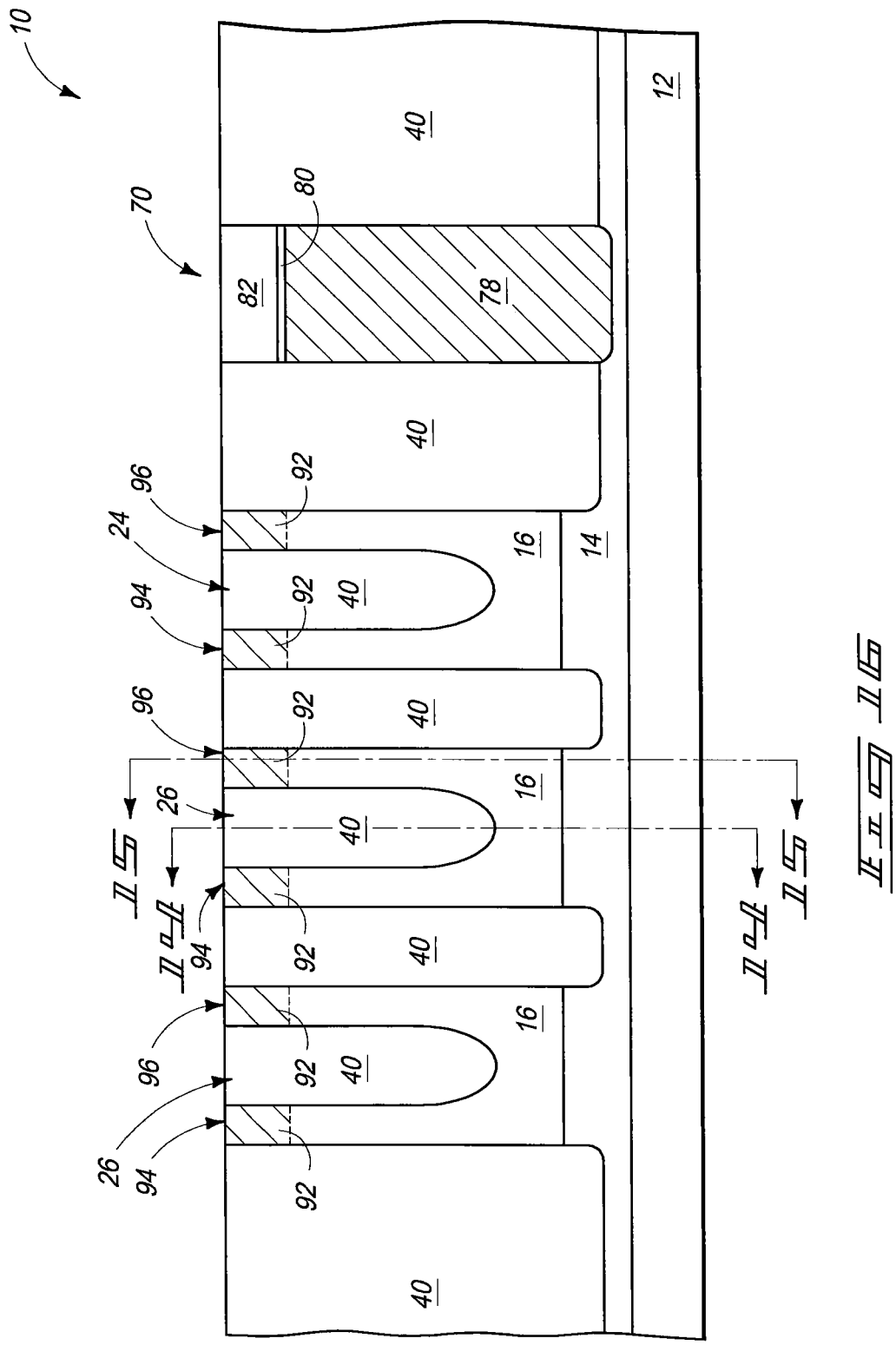
Figure 17:
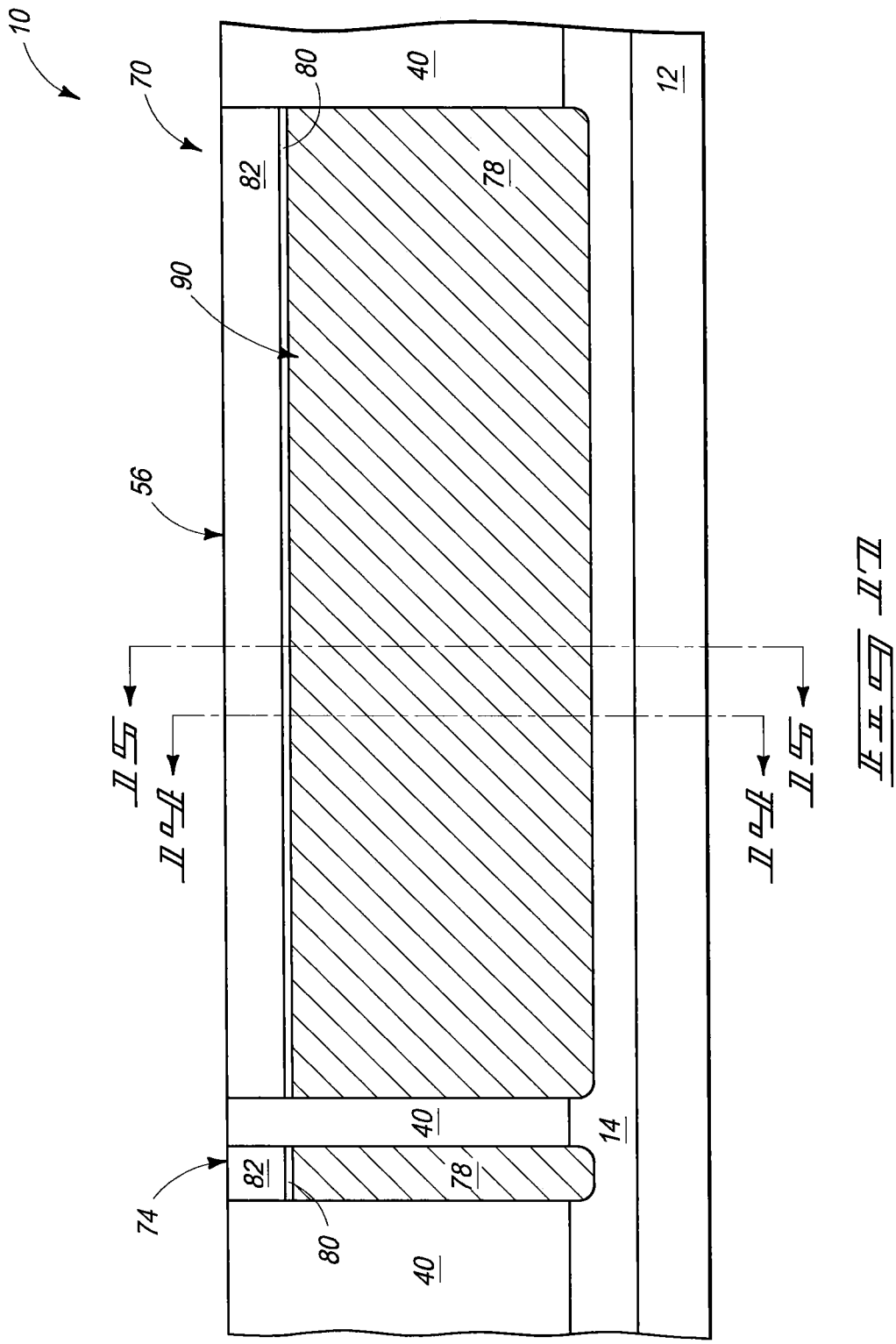
Figure 18:
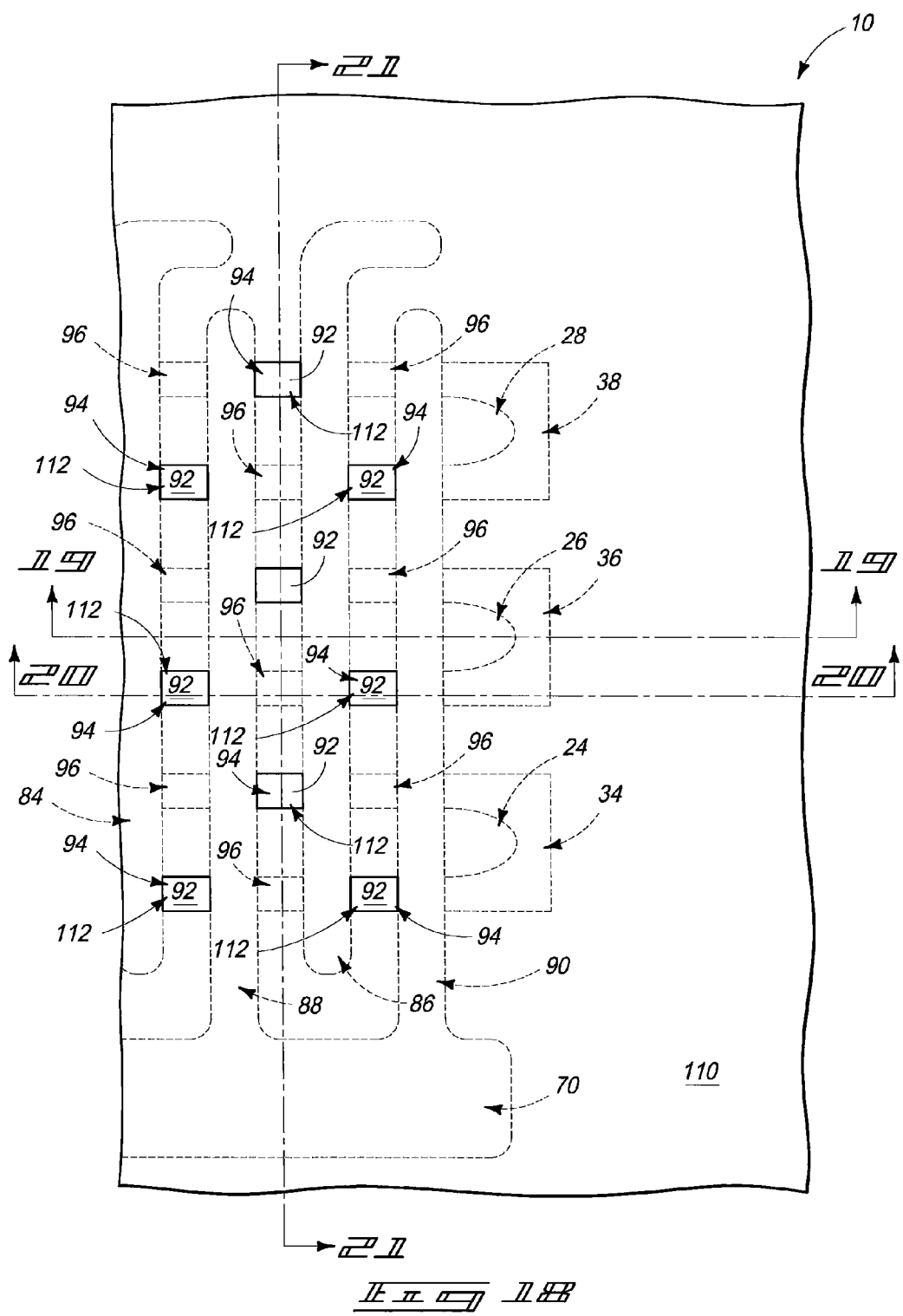
FIGS. 18-21 are views of the fragments of FIGS. 1-4, respectively, shown at a processing stage subsequent to that of FIGS. 13-17. The cross-sections of FIGS. 19, 20 and 21 are along the lines 19-19, 20-20 and 21-21, respectively, of FIG. 18. The cross-section of FIG. 21 is along lines 21-21 of FIGS. 19 and 20; and the cross-sections of FIGS. 19 and 20 are along the lines 19-19 and 20-20, respectively, of FIG. 21.
Figure 19:
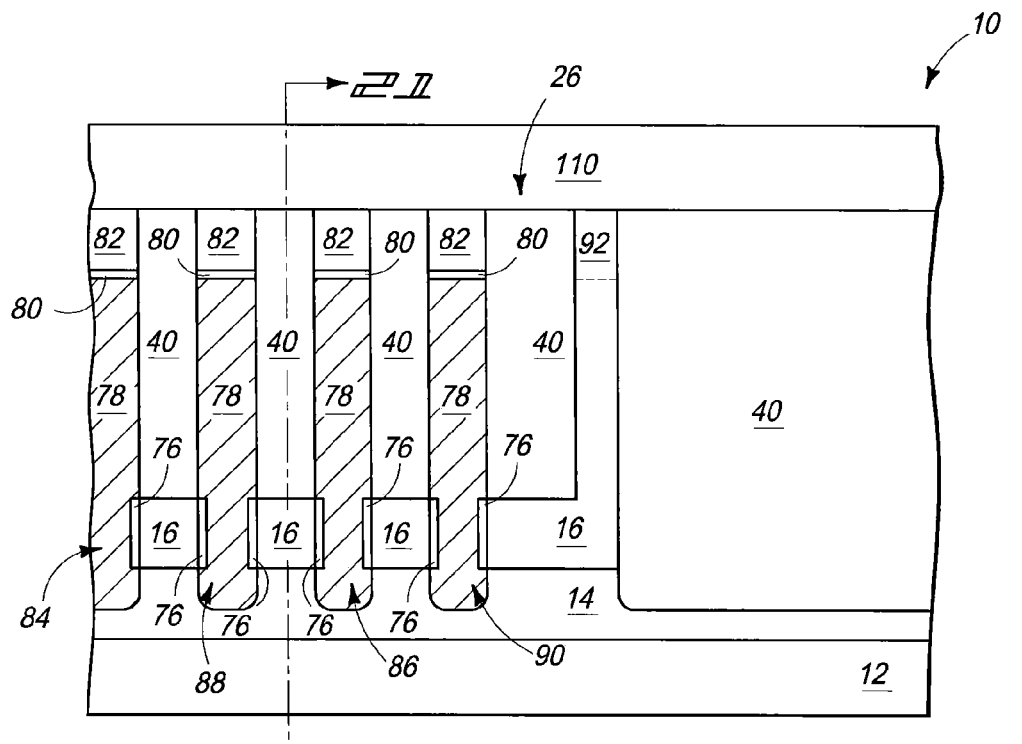
Figure 20:
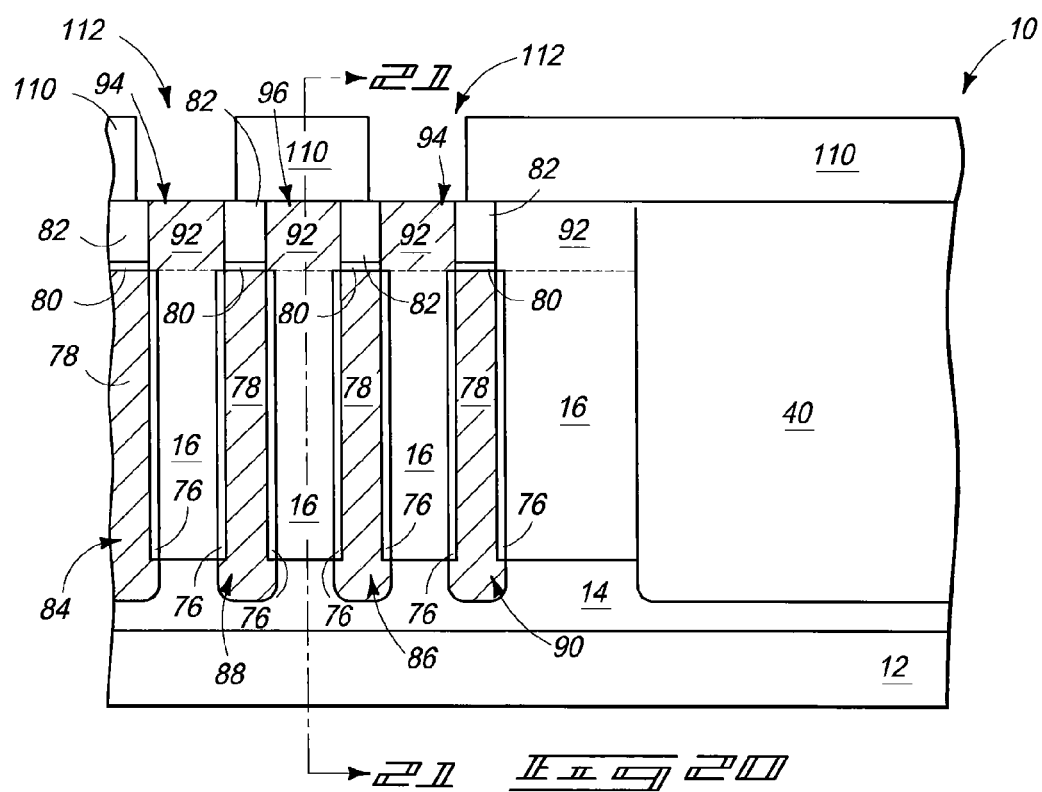
Figure 21:
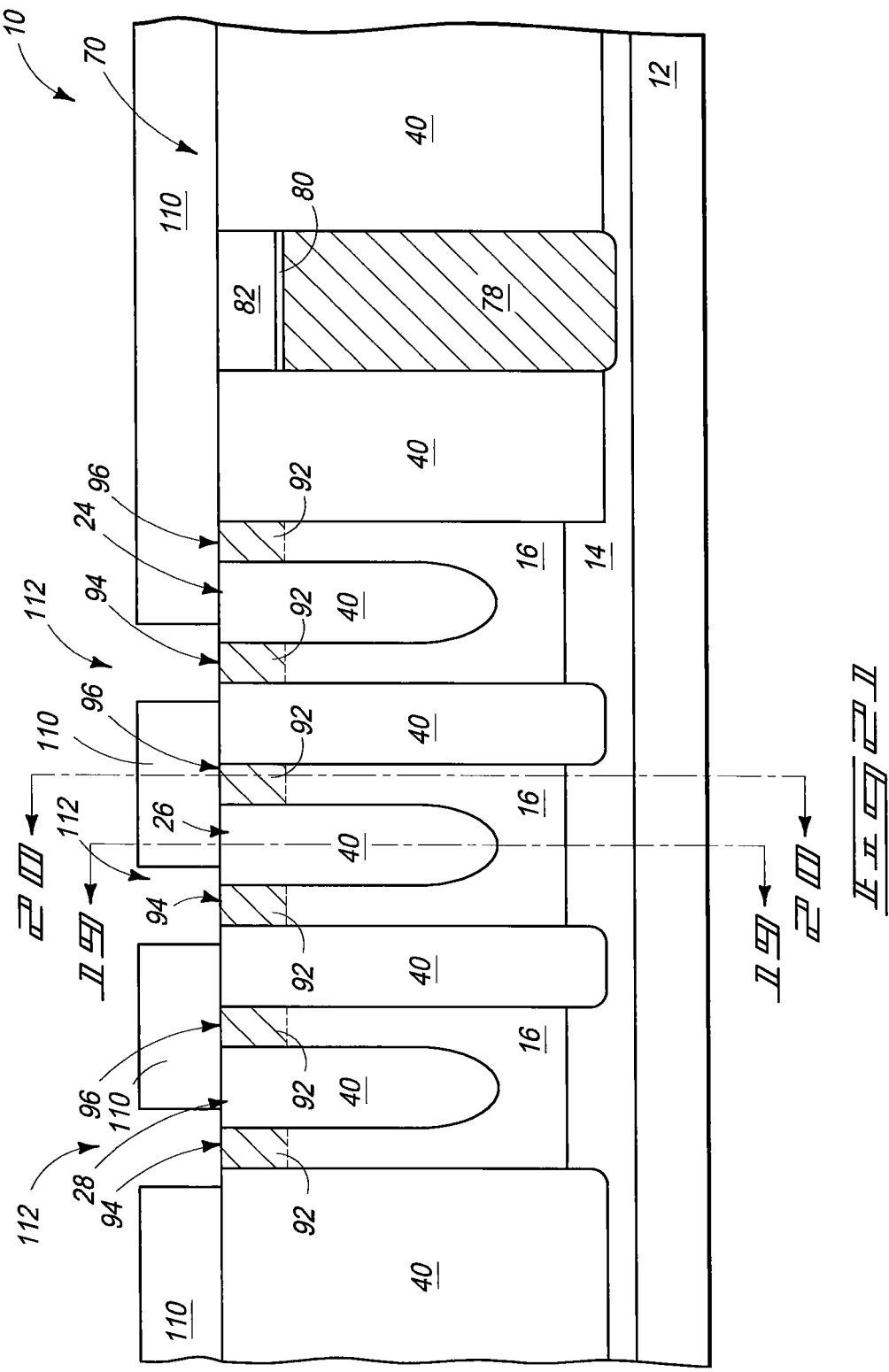
Figure 22:
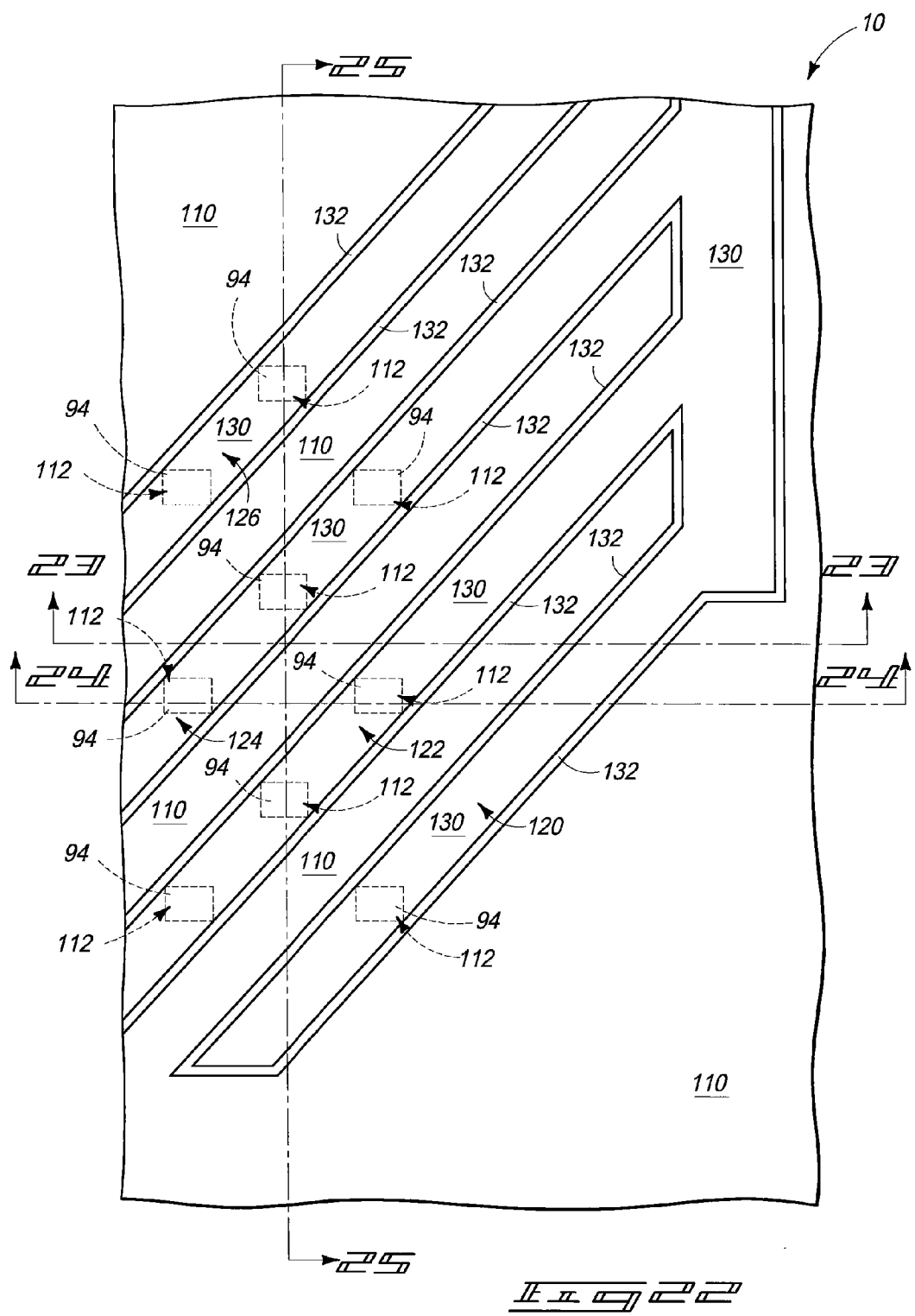
Figure 23:
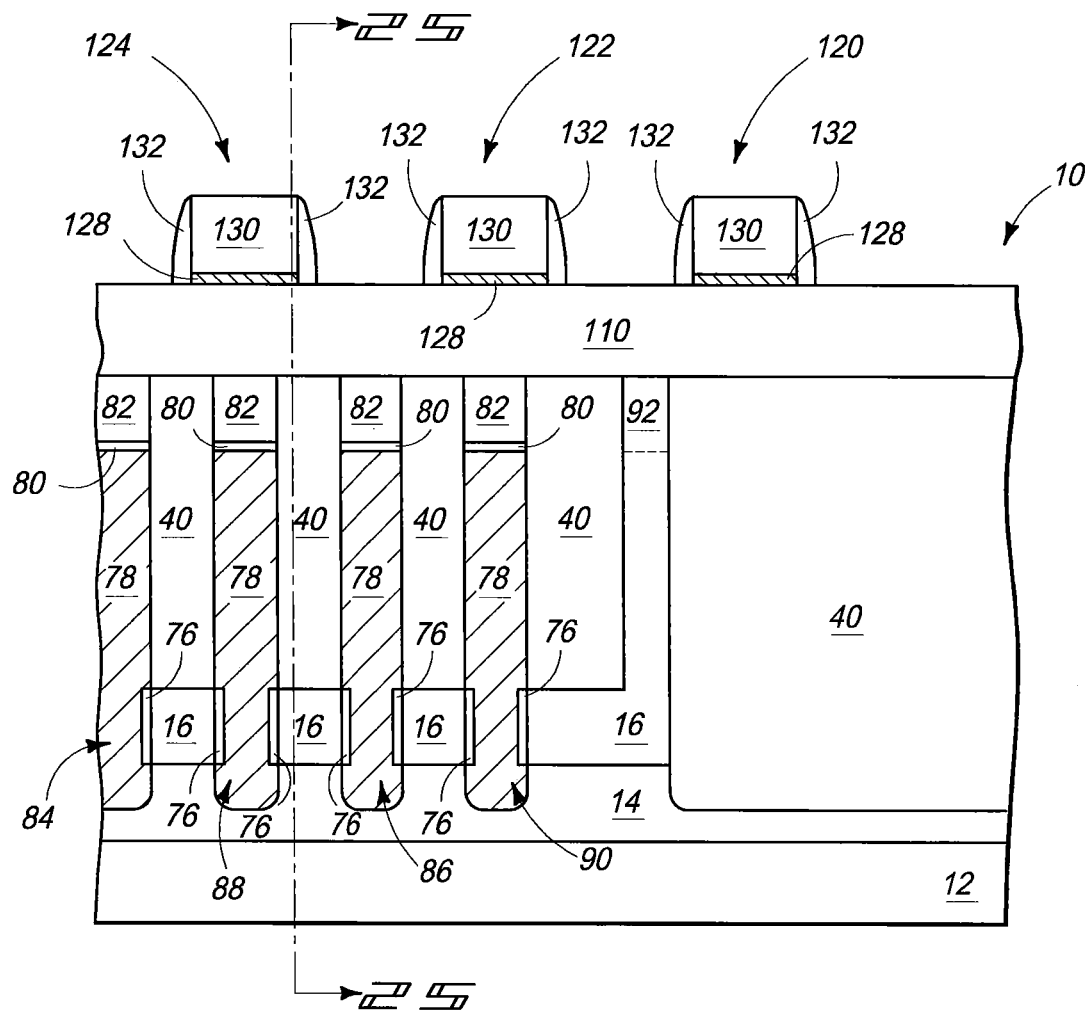
Figure 24:
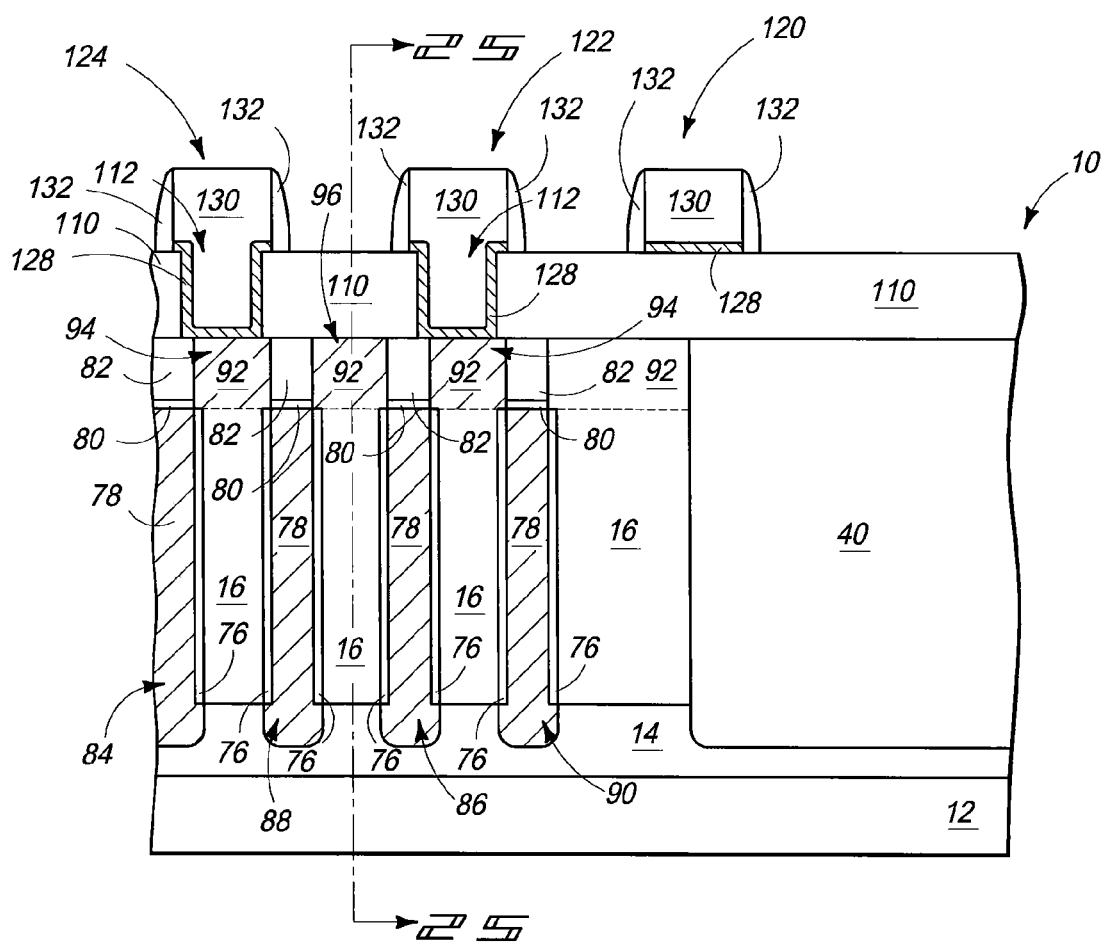
Figure 27:
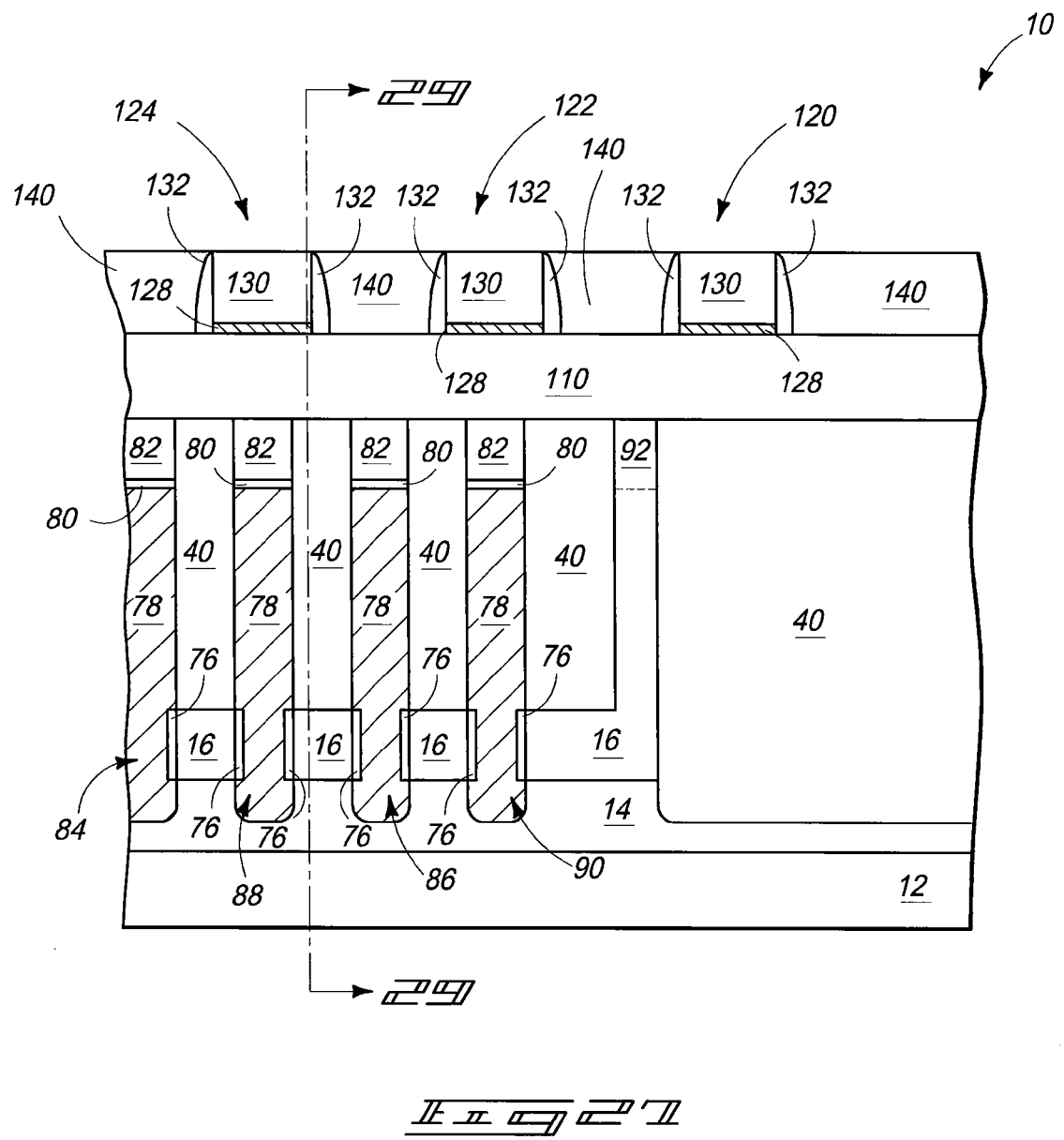
Figure 26:
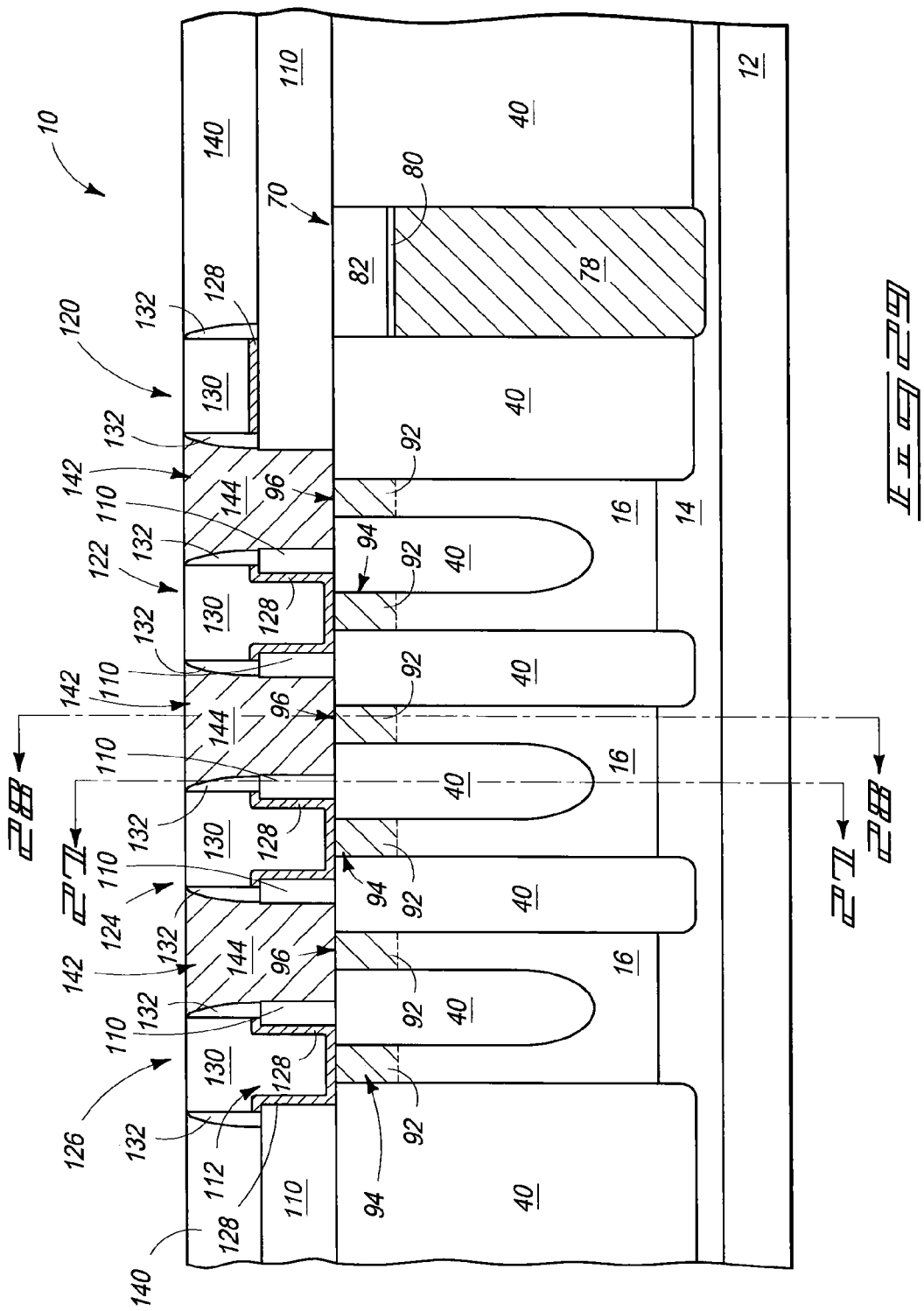
Figure 30:
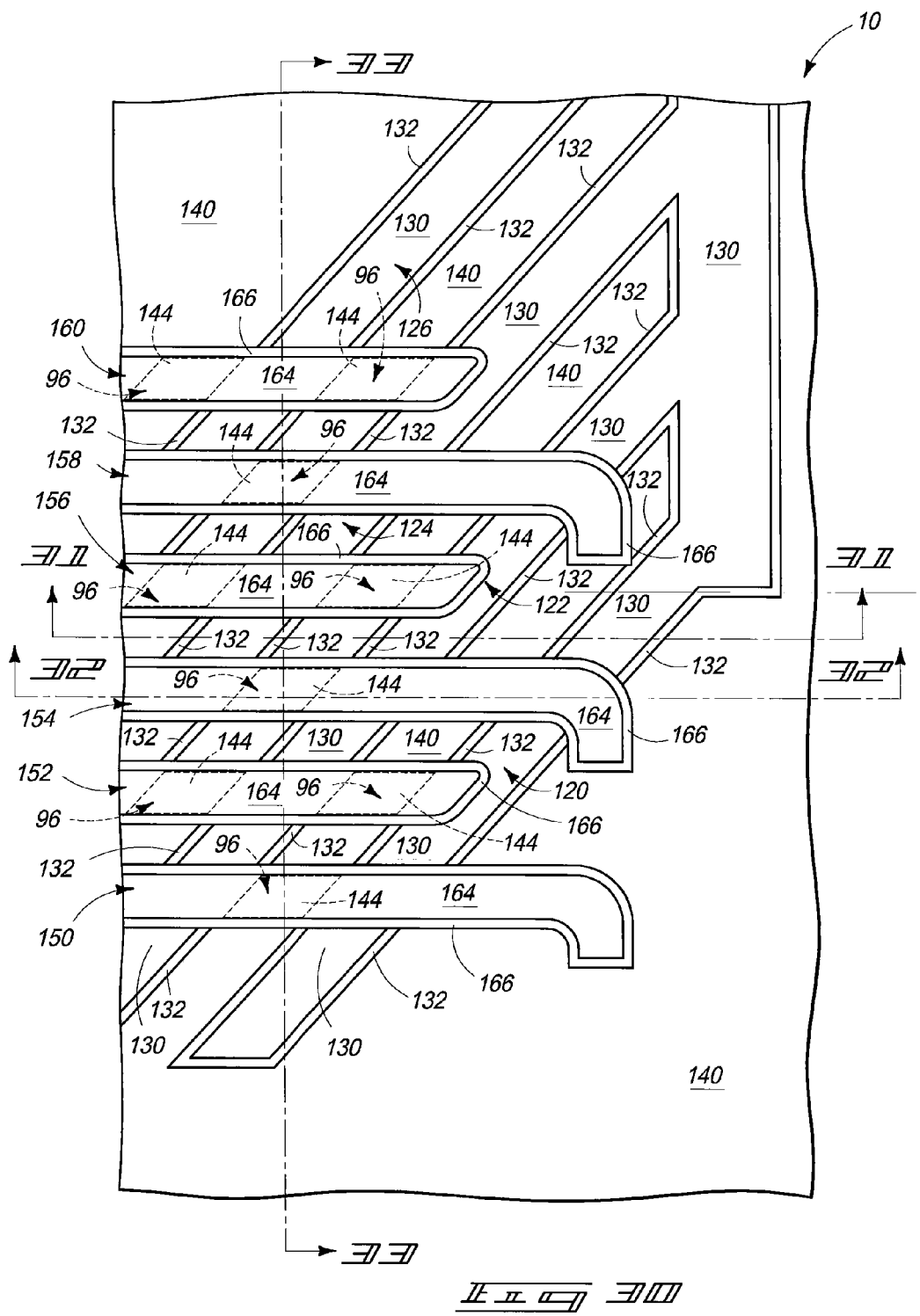
Figure 31:
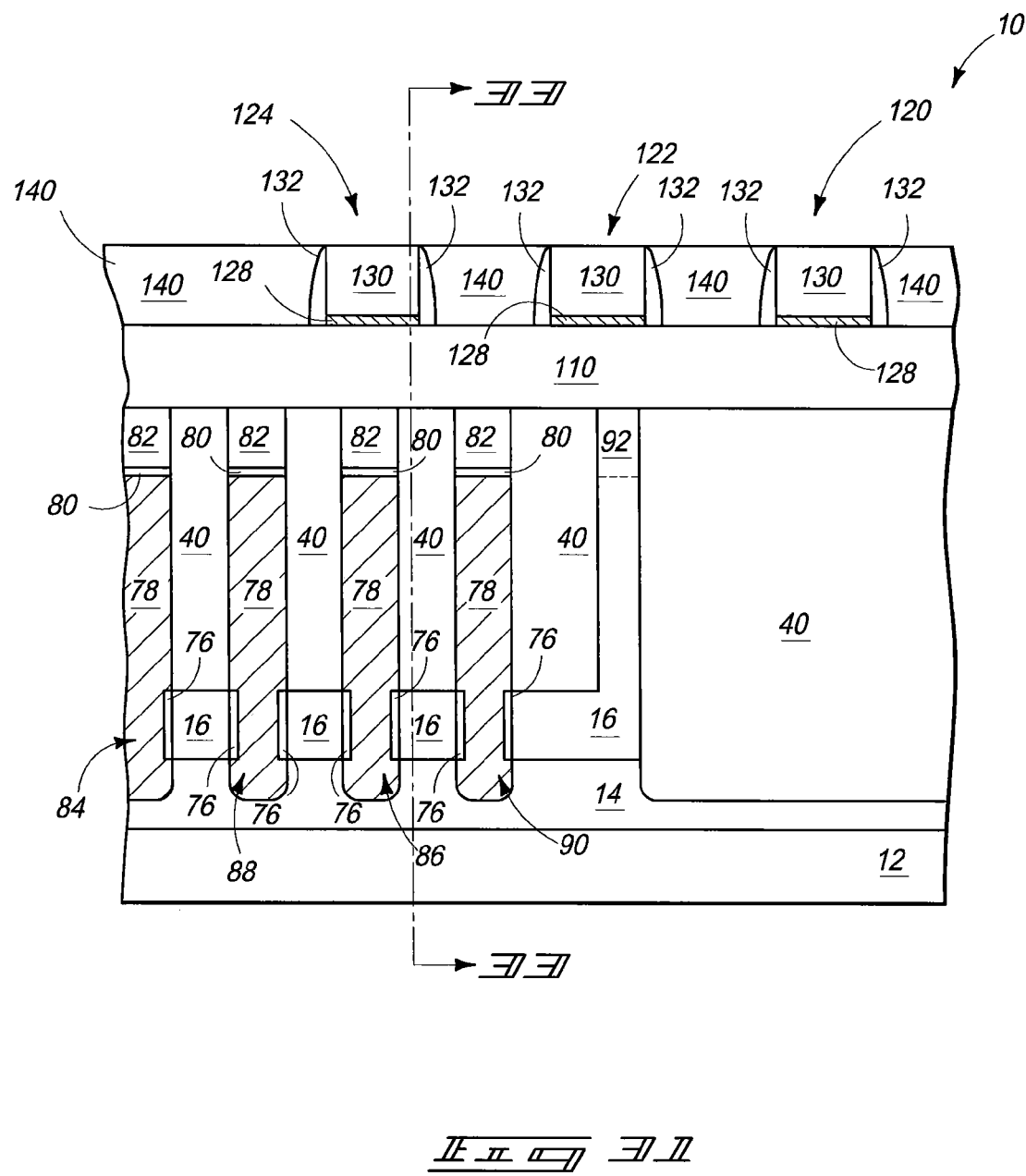
Figure 32:
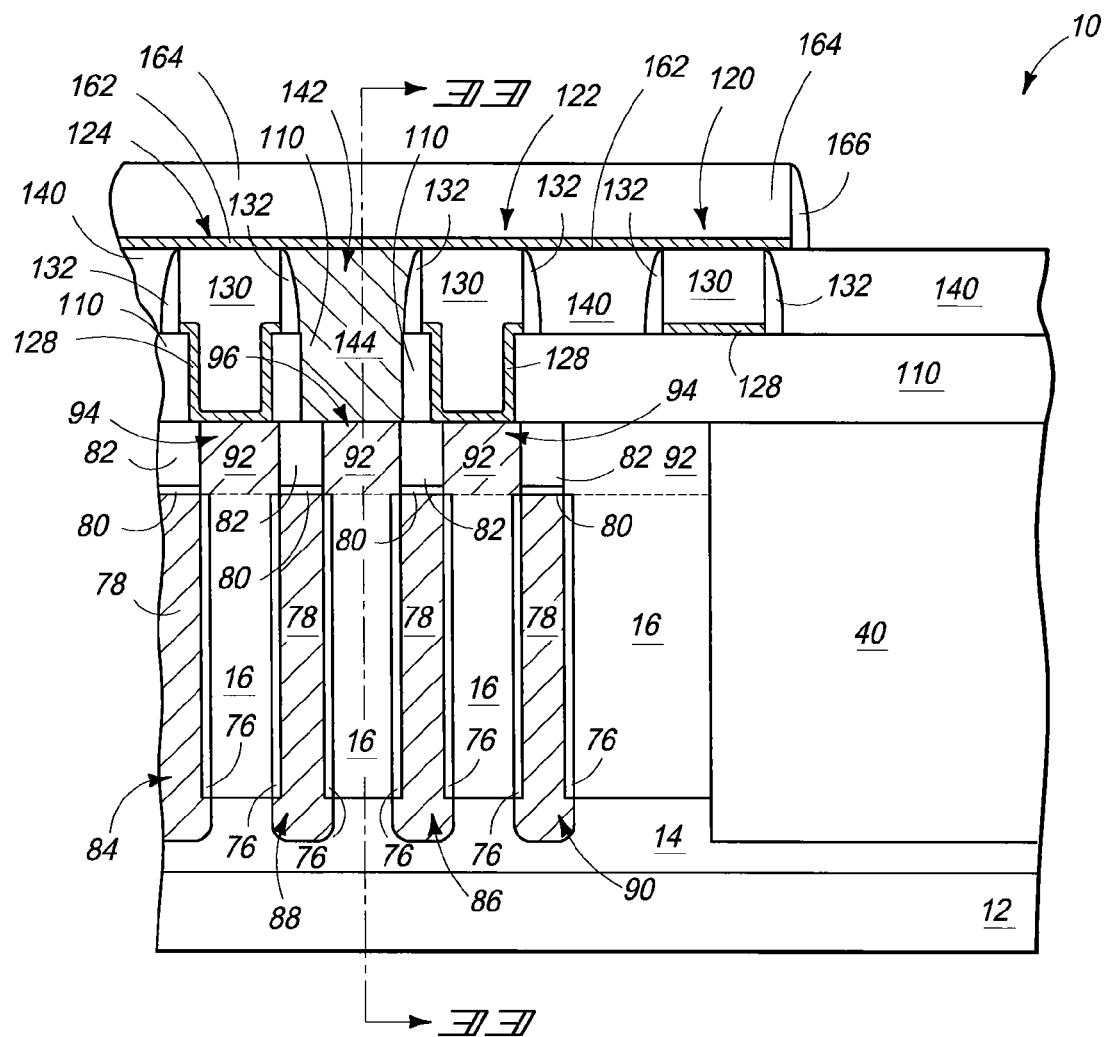
Figure 19:
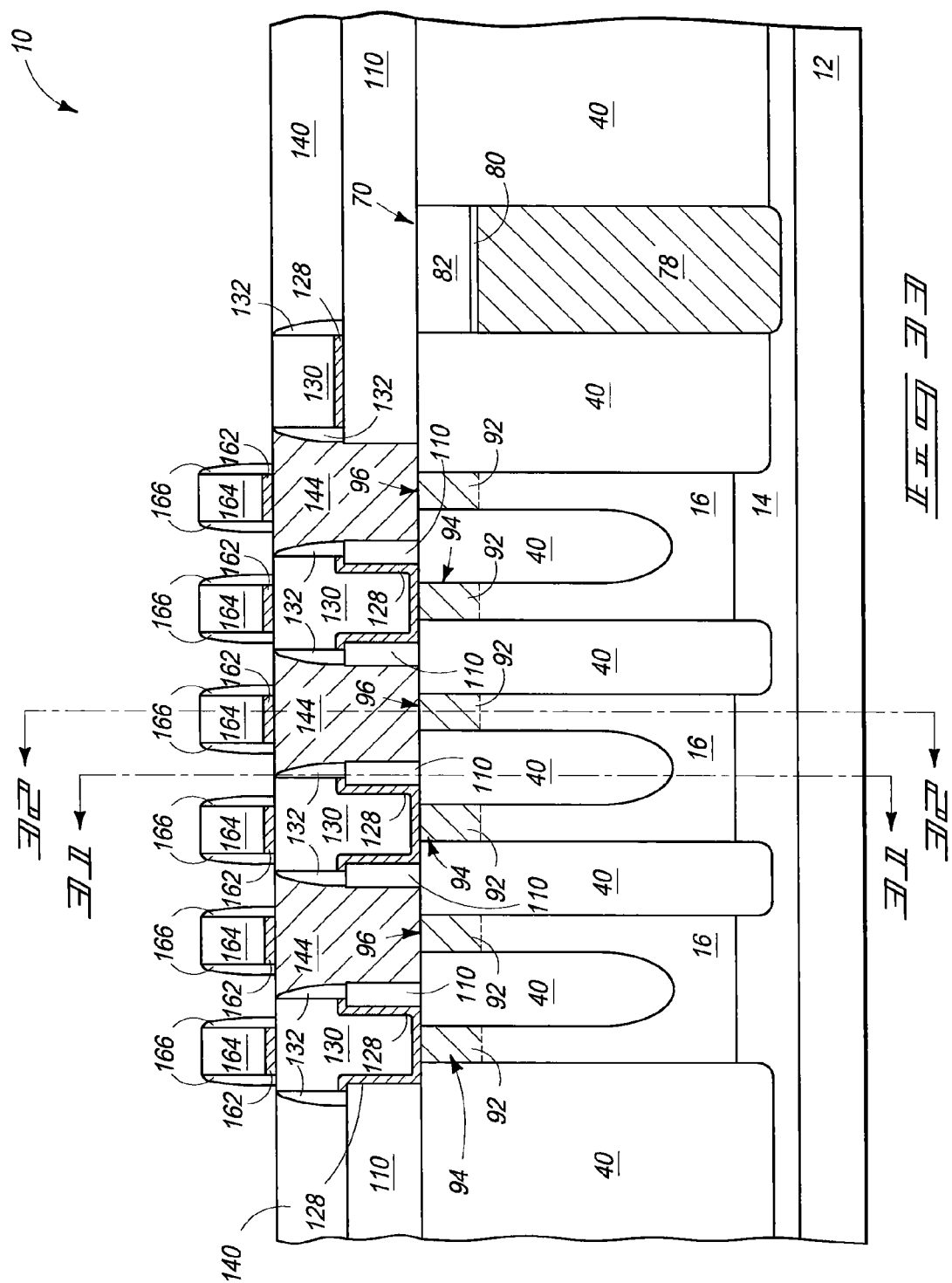
Figure 34:
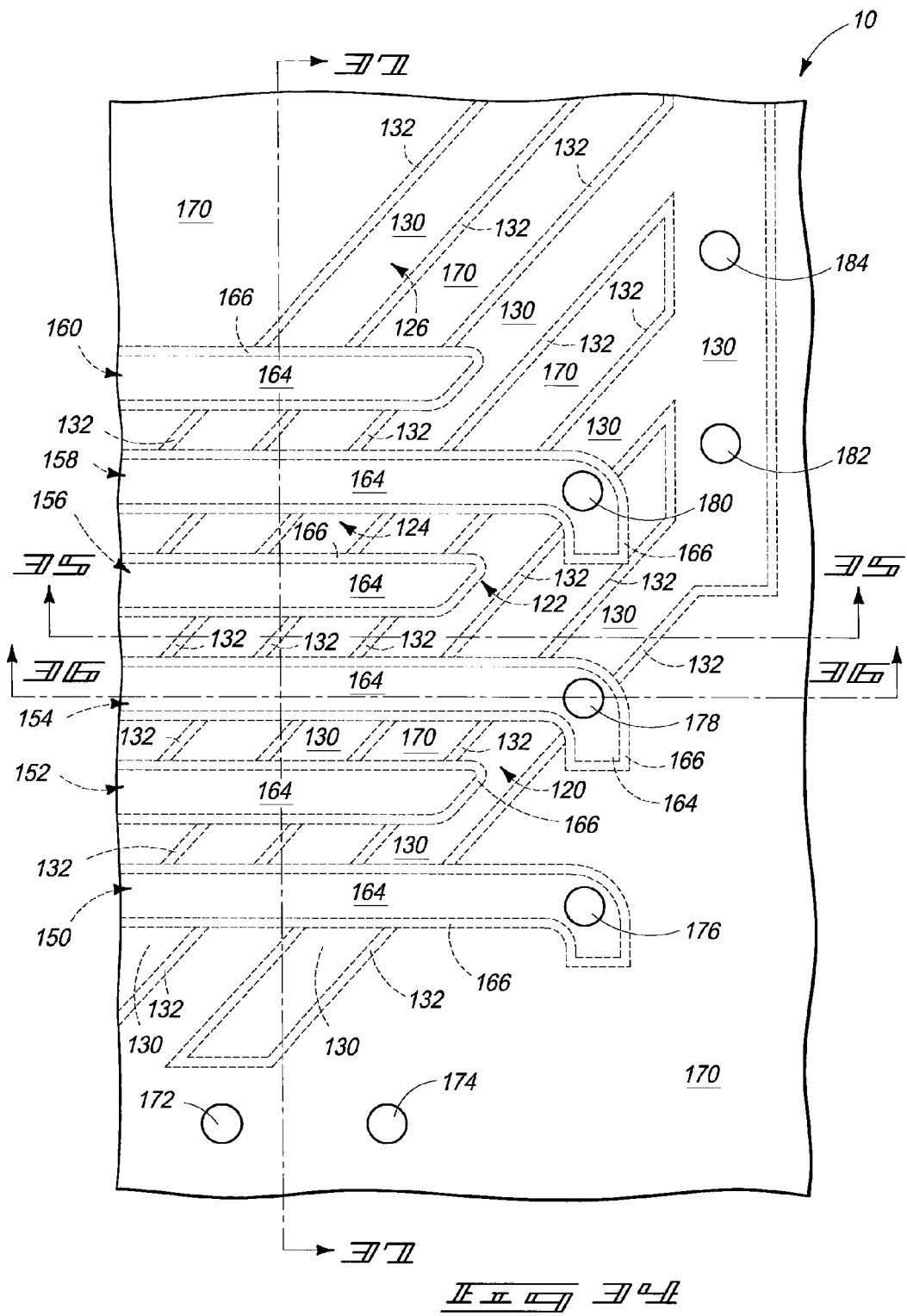
Figure 35:
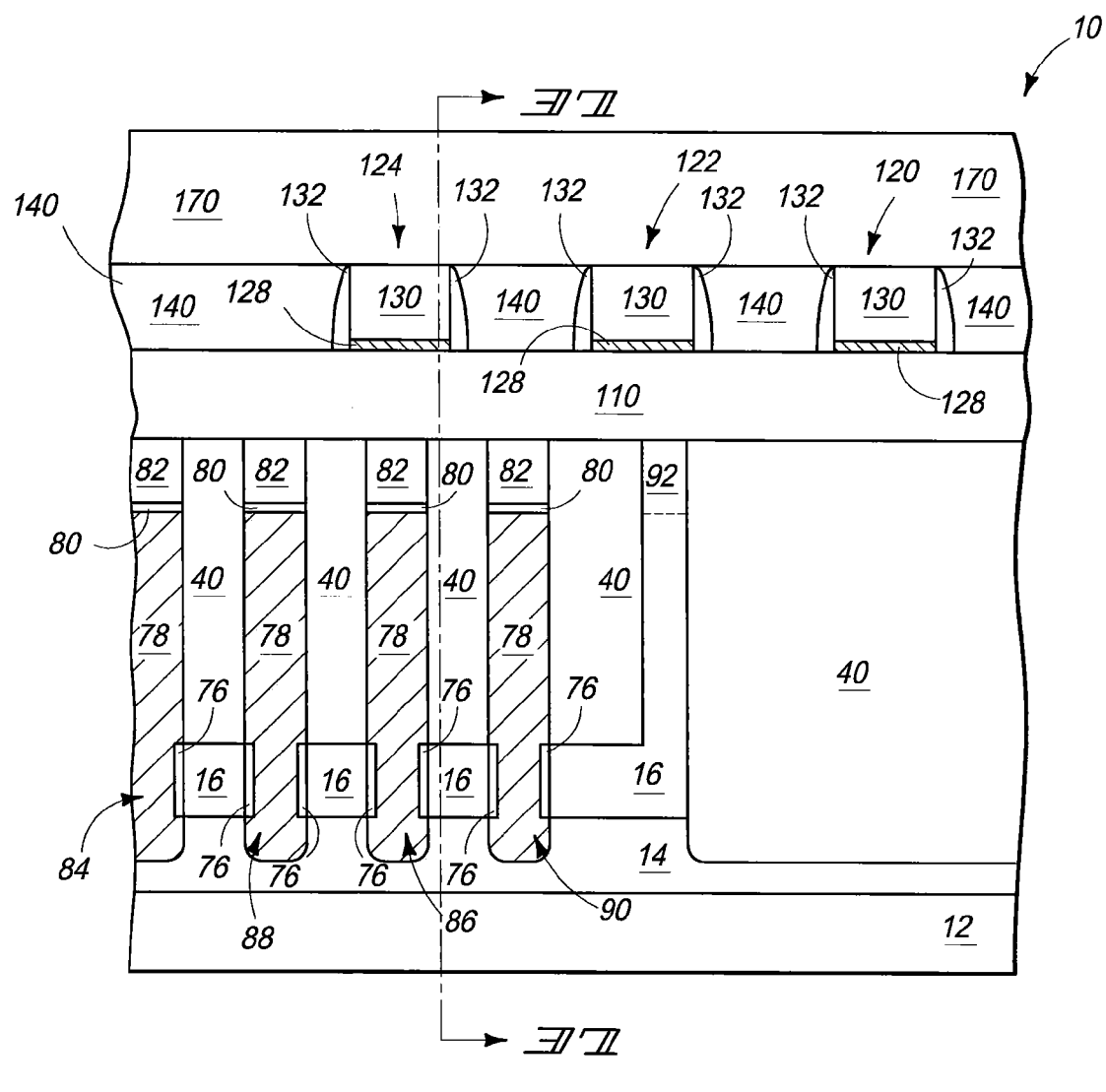
Figure 36:
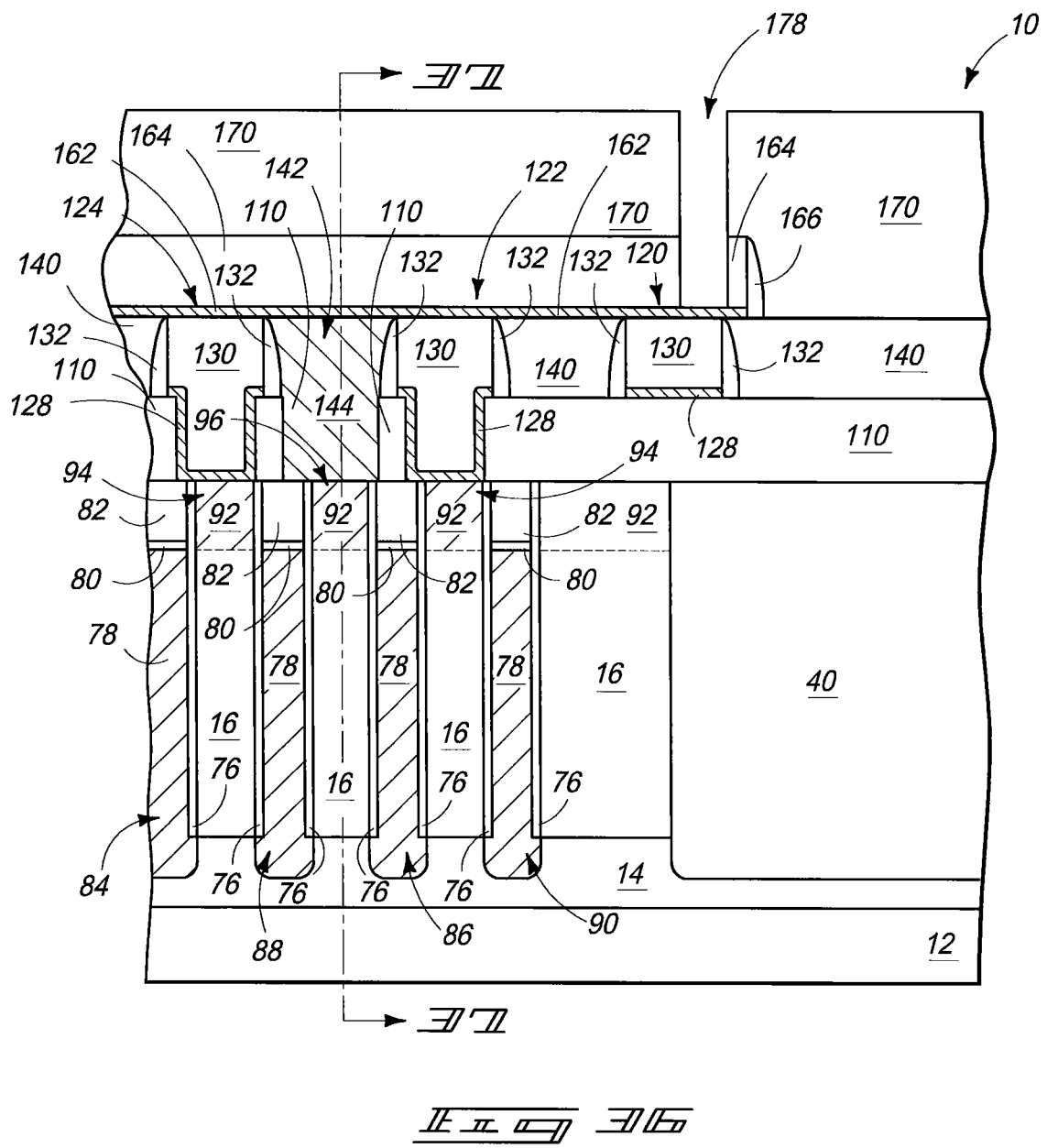

The cross-section of FIG. 16 shows that each trough-shaped semiconductor slice contains a source region 94 within one upwardly-projecting sidewall and a drain region 96 within the other upwardly-projecting sidewall.

The semiconductor material slices can be considered to be semiconductor material expanses adjacent the planar gates. In operation, the planar gates in combination with the semiconductor material expanses form floating body transistors. The source and drain within the prongs of a trough-shaped semiconductor expanse are gatedly connected to one another through a floating body contained within the central region of the semiconductor material 16 between the prongs. Such as illustrated in FIG. 38 which shows a three-dimensional view of a floating body transistor 100 comprising the semiconductor expanse 62 and the gatelines 86 and 88 on opposing sides of the expanse. The semiconductor materials 16 and 92 are shown in phantom view in FIG. 38 to indicate that such are behind various layers in the shown view. The gatelines 86 and 88 comprise the conductive material 78 which is separated from semiconductor material 16 by dielectric materials 76 (not shown in FIG. 38). The trough-shaped expanse corresponding to semiconductor materials 16 and 92 contains a pair of prongs (or upwardly projecting sidewalls) 102 and 104 which join to a central (or base) region 106. Source region 94 is within sidewall 102, and drain region 96 is within sidewall 104. The source and drain regions are gatedly connected to one another through the central region 106. In operation, gates 86 and 88 are a front gate and back gate, respectively, that control current flow through the central region 106 between the source and drain regions. The central region 106 comprises a floating body of the floating body transistor 100. As can be understood with reference to FIG. 13, such floating body transistor is one of a plurality of identical floating body transistors. Such plurality of floating body transistors can form a memory array.

The construction of FIG. 38 can be considered to comprise a front gate/back gate pair (the front gate 86 and back gate 88) having a single trough-shaped semiconductor material slice (the slice corresponding to semiconductor materials 16 and 92) sandwiched therebetween.

The arrangement of FIGS. 13-17 can be considered to include a series of electrically conductive plates, with the plates alternating between front gate plates and back gate plates; and to include an array of floating body transistors. The columns of the transistor array are between front gate plates and back gate plates. Each of the individual transistors along the columns has a source region and a drain region; and the source and drain regions of the transistors alternate with one another along the columns of the array.

Referring next to FIGS. 18-21, an electrically insulative material 110 is formed across an upper surface of construction 10 and patterned to have openings 112 extending therethrough to source regions 94. Material 110 can comprise any suitable composition or combination of compositions, and in particular aspects can comprise, consist essentially of, or consist of silicon dioxide. Various structures underlying material 110 are shown in phantom in FIG. 18.

Referring next to FIGS. 22-25, a series a source interconnect lines 120, 122, 124 and 126 are formed to electrically connect pluralities of the source regions 94 with one another. The source interconnect lines comprise conductive material 128 and electrically insulative capping material 130. Sidewall spacers 132 are formed along sidewall edges of the materials 128 and 130.

Conductive material 128 can comprise any suitable composition or combination of compositions, and in particular aspects will comprise metals (such as tungsten or titanium), metal compositions (such as metal nitrides or metal silicides), and/or conductively-doped semiconductor material (such as, for example, conductively-doped silicon).

Electrically insulative cap 130 can comprise any suitable composition or combination of compositions, and in particular aspects will comprise, consist essentially of, or consist of silicon nitride.

Sidewall spacers 132 can comprise any suitable composition or combination of compositions, and in particular aspects will comprise, consist essentially of, or consist of one or both of silicon nitride and silicon dioxide.

In the shown aspect of the invention, conductive material 128 extends within openings 112 to partially fill the openings, but does not entirely fill the openings; and material 130 fills the remainder of the openings. It is to be understood that the invention can also include aspects in which material 128 entirely fills openings 112.

The source interconnect lines can be formed with any suitable processing. In particular aspects, layers of materials 128 and 130 are first formed across material 110 and within the openings 112, and such layers are then patterned into desired structures utilizing a photolithographically patterned photoresist mask (not shown) and a suitable etch, after which the photoresist mask is removed. Sidewall spacers 132 are then formed by providing a layer of appropriate material across the patterned structures of materials 128 and 130, and across material 110, followed by anisotropic etching to convert the layer into the sidewall spacers.

In the shown aspect of the invention, the source regions are interconnected along directions which extend at angles of about 45° relative to the latitudinal directions 32 and longitudinal directions 68 discussed above with reference to FIG. 9. In other words, the source regions of the floating body transistors are tied to one another along diagonals extending about 45 degrees to the columns of the transistor array of FIGS. 13-17.

Referring to FIGS. 26-29, electrically insulative material 140 is formed across material 110 and over the source interconnect lines; and subsequently is planarized so the material 140 is between but not over the source interconnect lines. Material 140 can comprise any suitable composition or combination of compositions, and in particular aspects, can comprise, consist essentially of, or consist of one or both of silicon nitride and silicon dioxide.

Openings 142 are etched through materials 140 and 110 to the drain regions 96, and subsequently such openings are filled with conductive material 144. The locations of the openings 142 can be defined with a photolithographically patterned photoresist mask (not shown) which is removed after formation of the openings.

Conductive material 144 can comprise any suitable composition or combination of compositions, and in particular aspects will comprise metal, metal compositions, and/or conductively-doped semiconductor material. Conductive material 144 can be formed to fill the openings by initially providing the material to overfill the openings and then planarizing the material. Also, although the material is shown filling openings, it is to be understood that the conductive material can also be formed to line the openings rather than filling the openings in other aspects of the invention (not shown).

Figure 9:
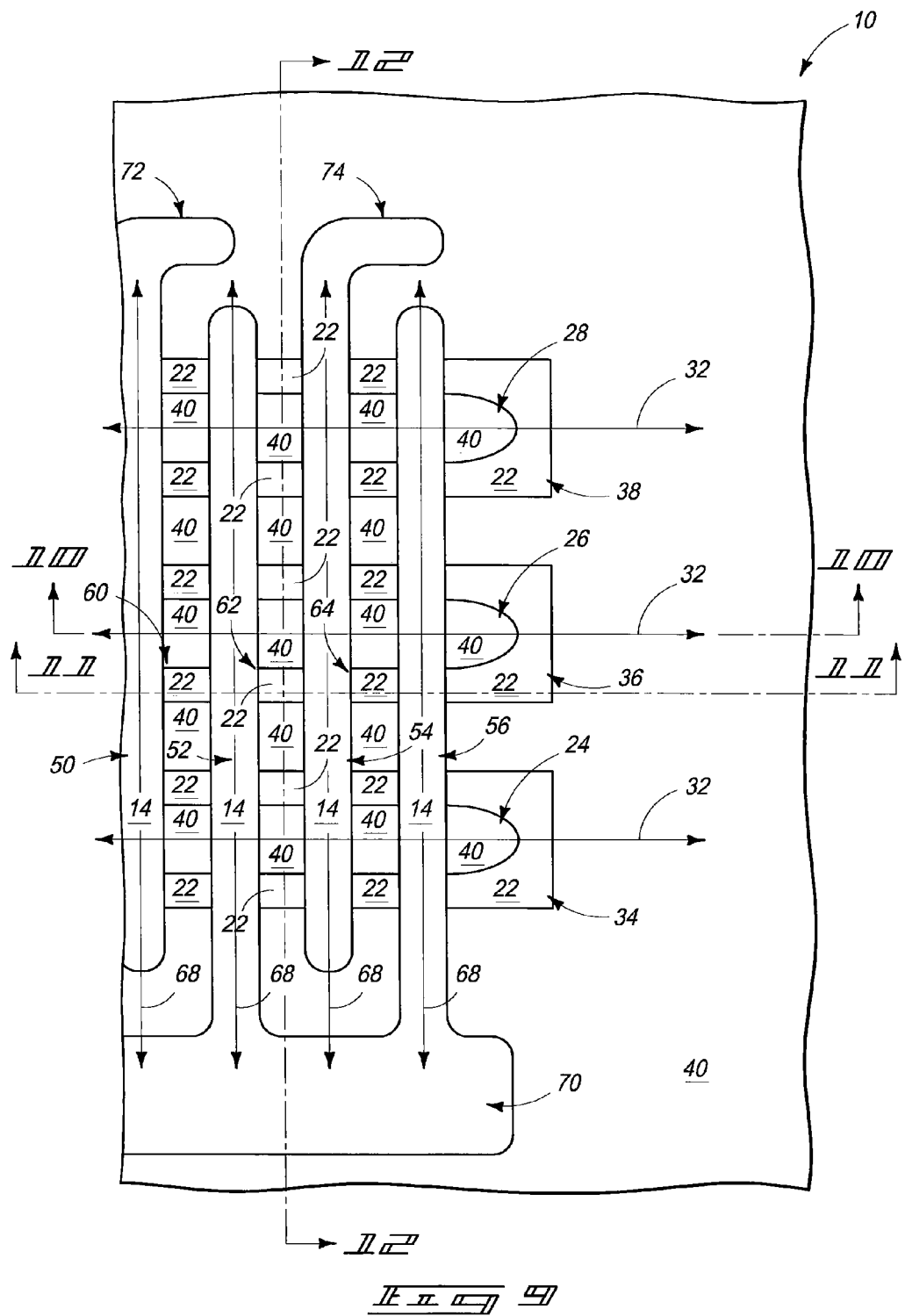
FIGS. 9-12 are views of the fragments of FIGS. 1-4, respectively, shown at a processing stage subsequent to that of FIGS. 5-8. The cross-sections of FIGS. 10, 11 and 12 are along the lines 10-10, 11-11 and 12-12, respectively, of FIG. 9. The cross-section of FIG. 12 is along lines 12-12 of FIGS. 10 and 11; and the cross-sections of FIGS. 10 and 11 are along the lines 10-10 and 11-11, respectively, of FIG. 12.

Referring next to FIGS. 30-33, bitlines 150, 152, 154, 156, 158 and 160 are provided to electrically connect the drain regions 96 along the latitudinal directions 32 (FIG. 9). The bitlines comprise conductive material 162, and an insulative cap 164. The bitlines are surrounded by sidewall spacers 166. Conductive material 162 electrically contacts to drain regions 96 through conductive interconnects corresponding to material 144.

The conductive material 162 can comprise any suitable composition or combination of compositions, including, for example, metal, metal compounds, and/or conductively-doped semiconductor material.

Electrically insulative cap 164 can comprise any suitable composition or combination of compositions, and in particular aspects will comprise, consist essentially of, or consist of one or both of silicon nitride and silicon dioxide.

Sidewall spacers 166 can comprise any suitable composition or combination of compositions, and in particular aspects will comprise, consist essentially of, or consist of one or both of silicon dioxide and silicon nitride.

The bitlines can be patterned by forming layers of material 162 and 164 across an upper surface of construction 10, forming a photolithographically patterned photoresist mask over the layers to define locations of the bitlines, transferring a pattern from the mask to the layers to form the bitlines, and then removing the mask. The sidewall spacers can be formed by providing a layer of appropriate material over the bitlines and across the remainder of construction 10, and then subjecting such layer to anisotropic etching.

Referring next to FIGS. 34-37, an electrically insulative material 170 is formed across construction 10, and subsequently openings 172, 174, 176, 178, 180, 182 and 184 are etched through the material to various conductive layers. The openings can be filled with appropriate electrically conductive interconnects to connect bitlines, back gates, front gates and source interconnects to appropriate circuitry to read and write from the memory array. Although the openings are shown being formed simultaneously, persons of ordinary skill in the art will recognize that the openings can be formed at different times relative to one another. Insulative material 170 can comprise any suitable composition or combination of compositions including, for example, silicon nitride and/or silicon dioxide.

A floating gate memory cell formed in accordance with aspects of the present invention can be accessed for reading and writing with any appropriate electrical parameters. For instance, a writing operation to write a "1" can be conducted with a front gate voltage of −2.0 volts, a drain voltage of 1.0 volt, and a back gate voltage of −1.0 volt. A writing operation to write a "0" can be conducted with a front gate voltage of 0.8 volts, a drain voltage of −1.0 volt, and a back gate voltage of −1.0 volt. A reading operation can be conducted with a front gate voltage of 0.8 volts, a drain voltage of 0.2 volts, and a back gate voltage of −1.0 volt. In such operations, the back gate is biased to −1.0 volt for hole retention in the floating body.

Although the shown configuration utilizes both front gates and back gates, it is to be understood that the back gates can be eliminated in some aspects of the invention. However, it can be advantageous to utilize the back gates to assist in reading and writing from the floating body transistors. It can be further advantageous if all of the back gates are electrically coupled to one another and thus easily maintained at an identical bias.

In the shown aspect the invention, at least some of the front gates are shared between pairs of floating body transistors on opposing sides of the front gates, and similarly, at least some of the individual back gates are shared between pairs of floating body transistors on opposing sides of the back gates. This can enable high integration of memory arrays formed in accordance with aspects of the present invention.

Semiconductor assemblies in accordance with various aspects of the present invention can be utilized in numerous applications. For instance, the assemblies can be incorporated into various electronic systems, such as, for example, computer systems, phones, cars, airplanes, camcorders, cameras, medical devices, etc. The assemblies can provide various circuit functions within such systems, including memory and/or processing functions.

In compliance with the statute, the invention has been described in language more or less specific as to structural and methodical features. It is to be understood, however, that the invention is not limited to the specific features shown and described, since the means herein disclosed comprise preferred forms of putting the invention into effect. The invention is, therefore, claimed in any of its forms or modifications within the proper scope of the appended claims appropriately interpreted in accordance with the doctrine of equivalents.

The invention claimed is:

1. A floating body transistor construction comprising a U-shaped semiconductor material; the U-shape having a pair of limbs joined to a central portion; each of the limbs containing a source/drain region of a pair of gatedly-coupled source/drain regions; and the floating body of the transistor extending across the central portion between the source/drain regions, the floating body transistor being separated from each laterally adjacent floating bogy transistor by a trench filled with an electrically insulative material, the trench extending below the central portion of the transistor and into insulative material of a semiconductor-on-insulator construction.

2. The construction of claim 1 further comprising electrically insulative material filling the U of the U-shaped semiconductor material.

3. The construction of claim 2 wherein the electrically insulative material comprises silicon dioxide.

4. The construction of claim 2 wherein the electrically insulative material consists of silicon dioxide.

5. The construction of claim 1 wherein the semiconductor material comprises monocrystalline silicon.

6. The construction of claim 1 wherein the semiconductor material consists of monocrystalline silicon.

7. The construction of claim 1 wherein the semiconductor material is a planar expanse; and further comprising a planar gate on one side of the semiconductor material expanse.

8. The construction of claim 7 further comprising gate oxide between the planar gate and the semiconductor material expanse.

9. The construction of claim 7 wherein the planar gate comprises one or more metals.

10. The construction of claim 7 wherein the planar gate comprises one or more of titanium, ruthenium and titanium nitride.

11. The construction of claim 1 wherein the semiconductor material is a planar expanse; and further comprising a planar front gate on one side of the semiconductor material expanse, and a planar back gate on an opposing side of the semiconductor material expanse.

12. The construction of claim 11 wherein the front gate and the back gate are identical in composition to one another.

13. The construction of claim 12 wherein the composition includes one or more metals.

14. The construction of claim 12 wherein the composition includes one or more of titanium, ruthenium and titanium nitride.

15. The construction of claim 11 further comprising:
    first gate oxide between the front gate and the semiconductor material expanse; and
    second gate oxide between the back gate and the semiconductor material expanse.

16. A semiconductor construction comprising:
    an electrically conductive plate;
    an expanse of semiconductor material adjacent the plate, and spaced from the plate by one or more dielectric materials; the expanse having a pair of prongs extending from a base portion; the prongs comprising conductively-doped regions;
    an insulative material between the prongs;
    a floating body transistor comprising at least a portion of the semiconductor material and at least a portion of the plate, the conductively-doped regions of the prongs being source/drain regions of the transistor, the plate comprising a gate of the transistor, and the base portion of the expanse comprising the floating body of the transistor; and
    pair of trenches filled with an electrically insulative material on opposing sides of prongs, the trenches extending below the base portion of the transistor and into insulative material of a semiconductor-on-insulator construction.

17. The construction of claim 16 wherein the insulative material comprises silicon dioxide.

18. The construction of claim 16 wherein the insulative material consists of silicon dioxide.

19. The construction of claim 16 wherein the semiconductor material comprises monocrystalline silicon.

20. The construction of claim 16 wherein the semiconductor material consists of monocrystalline silicon.

21. The construction of claim 16 wherein the one or more dielectric materials include silicon dioxide.

22. The construction of claim 16 wherein the one or more dielectric materials consist of silicon dioxide.

23. The construction of claim 16 wherein the plate comprises one or more metals.

24. The construction of claim 16 wherein the plate comprises one or more of titanium, ruthenium and titanium nitride.

* * * * *

UNITED STATES PATENT AND TRADEMARK OFFICE
CERTIFICATE OF CORRECTION

PATENT NO. : 8,946,815 B2  
APPLICATION NO. : 13/959339  
DATED : February 3, 2015  
INVENTOR(S) : Sanh D. Tang et al.

Page 1 of 1

It is certified that error appears in the above-identified patent and that said Letters Patent is hereby corrected as shown below:

In the Claims

In column 11, line 34, in Claim 1, delete "bogy" and insert -- body --, therefor.

In column 12, line 35, in Claim 16, delete "pair" and insert -- a pair --, therefor.

In column 12, line 36, in Claim 16, after "sides" insert -- of the pair --.

Signed and Sealed this
Fifth Day of May, 2015

Michelle K. Lee
*Director of the United States Patent and Trademark Office*